(12) United States Patent
Toda

(10) Patent No.: US 6,449,727 B1
(45) Date of Patent: Sep. 10, 2002

(54) HIGH-SPEED DATA TRANSFER SYNCHRONIZING SYSTEM AND METHOD

(75) Inventor: Haruki Toda, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/306,724

(22) Filed: May 7, 1999

(30) Foreign Application Priority Data

May 7, 1998 (JP) .......................................... 10-124636

(51) Int. Cl.[7] .............................. G06F 1/12; G06F 12/00
(52) U.S. Cl. ....................................... 713/401; 711/167
(58) Field of Search ................................ 713/400, 401, 713/500; 711/167–169

(56) References Cited

U.S. PATENT DOCUMENTS 6,003,118 A * 12/1999 Chen ........................... 711/167
6,185,644 B1 * 2/2001 Farmwald et al. ........... 710/102

OTHER PUBLICATIONS

Takanori Saeki, et al., "A 10ps Jitter 2 Clock Cycle Lock Time CMOS Digital Clock Generator Based on an Interleaved Synchronous Mirror Delay Scheme," 1997 Symposium on VLSI Circuits Digest of Techical Papers, JSAP CAT No. AP971309, IEEE CAT No. 97CH 36115, Jun. 12–14, 1997, pp. 109–110.

* cited by examiner

Primary Examiner—Thomas M. Heckler
(74) Attorney, Agent, or Firm—Banner & Witcoff, Ltd.

(57) ABSTRACT

One memory controller and a plurality of memory modules are connected to a data bus line, clock bus line, and command bus line. Each memory module includes an internal clock signal generating circuit for generating internal clocks synchronizing with external clock signals output from the memory controller. This internal clock signal generating circuit has a function of adjusting the timing of a generated internal clock signal on the basis of a control signal in accordance with the position on the bus lines of a memory module having this internal clock signal generating circuit.

22 Claims, 20 Drawing Sheets

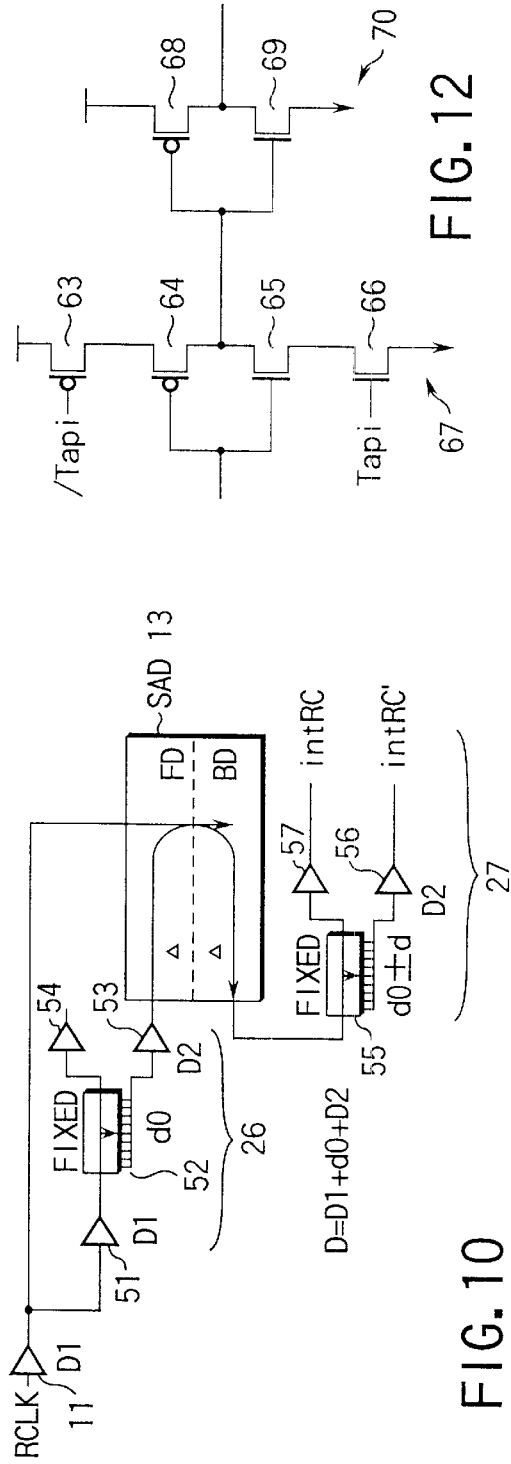
FIG. 10
FIG. 12
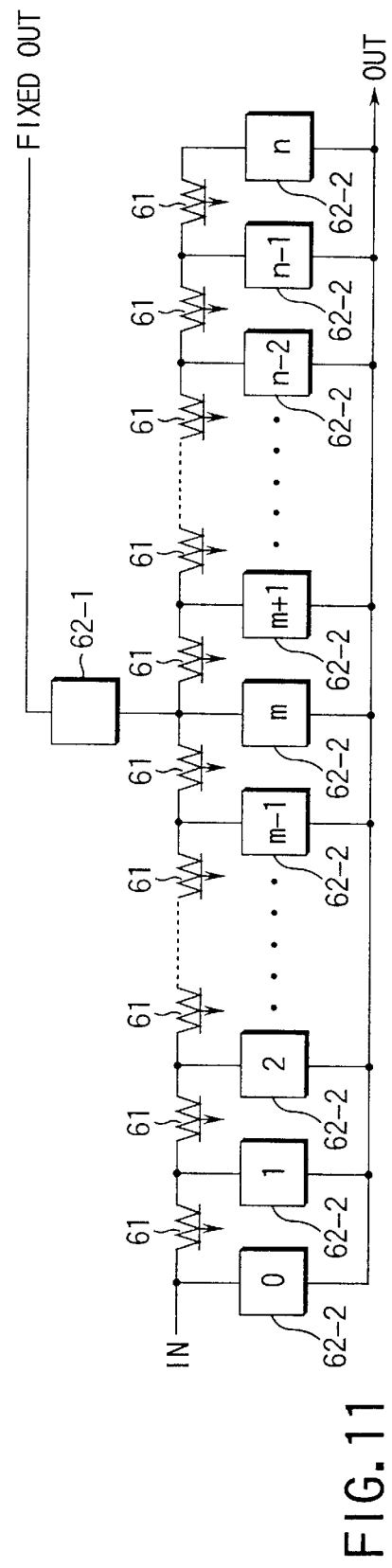
FIG. 11

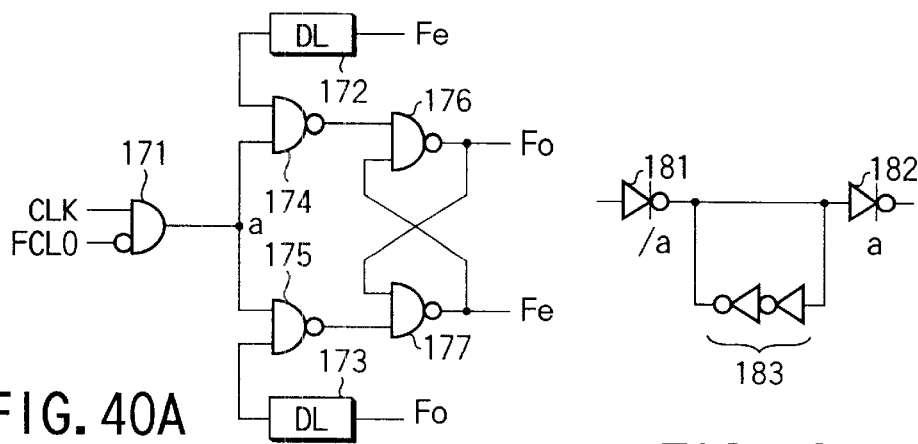
FIG. 40A
FIG. 40B
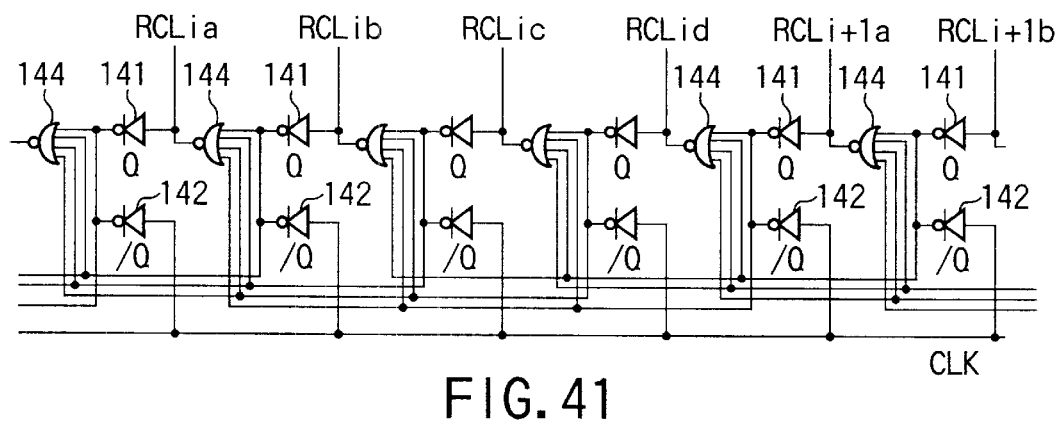
FIG. 41
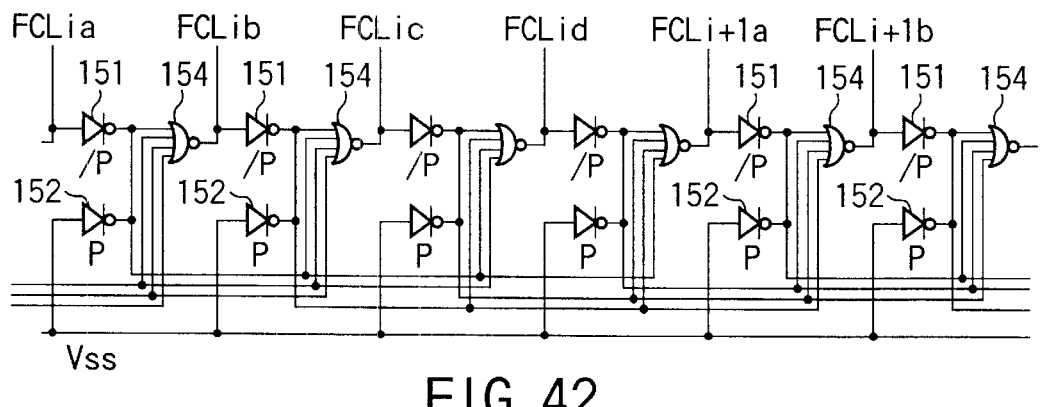
FIG. 42

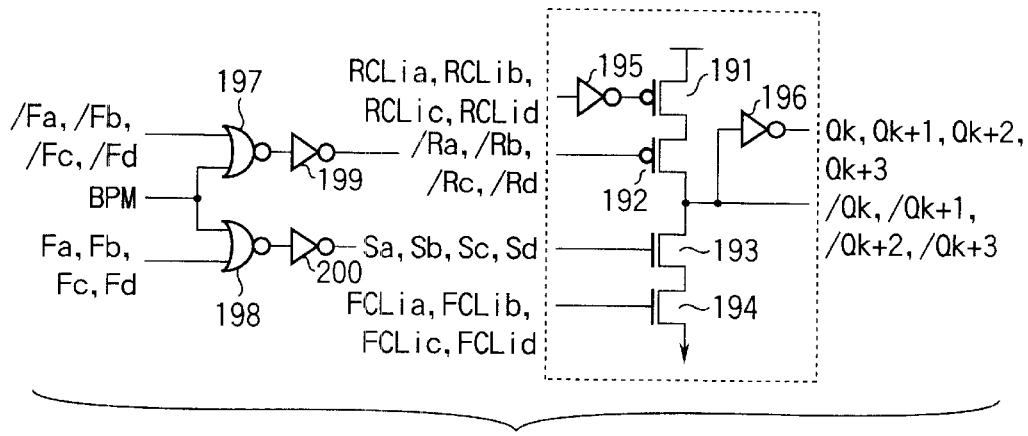
FIG. 43
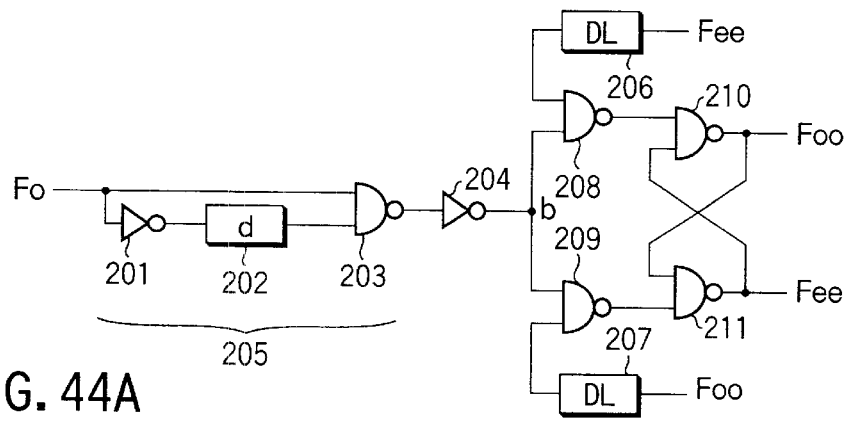
FIG. 44A
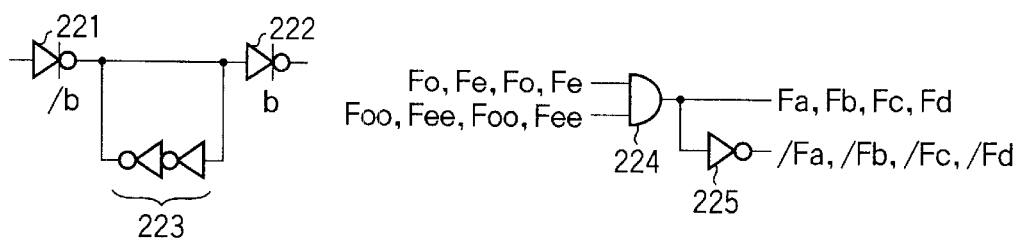
FIG. 44B
FIG. 44C

HIGH-SPEED DATA TRANSFER SYNCHRONIZING SYSTEM AND METHOD

BACKGROUND OF THE INVENTION

The present invention relates to a memory board system including a plurality of memory modules and a memory controller for controlling these memory modules to exchange data with the memory modules. The present invention further relates to a high-speed data transfer synchronizing system and high-speed data transfer synchronizing method capable of reliably performing high-speed data transfer in synchronism with a clock signal even in different device environments constructed of a memory controller and memory modules.

In the field of information processors, the performance of microprocessor units (MPUS) has improved, and the capacity of IC memories used has also greatly increased to 256 Mbits, 1 Gbits, and the like. Under the circumstances, it is becoming more and more important to efficiently transfer large amounts of data between a memory module including a plurality of IC memories and an MPU.

Generally, a memory board system is constructed by combining a plurality of memory modules and a memory controller.

FIG. 1 shows an outline of the arrangement of a memory board system. A clock generator CG formed in a memory controller (to be simply referred to as a controller hereinafter) MEC generates a clock signal. The clock signal generated by this clock generator CG is sequentially transferred as a clock signal TCLk along an array of a plurality of memory modules MM1 to MMn. This clock signal TCLK is returned in the position of the memory module MMn farthest from the controller MEC. The clock signal TCLK is then sequentially transferred as a clock signal RCLK in the opposite direction along the array of the memory modules and transmitted to the controller MEC. Note that each memory module is formed by, e.g., mounting a plurality of memory ICs on a print circuit board.

An output command from the controller MEC is transferred to the memory modules MM1 to MMn via a command bus. Each memory module receives the command from the command bus in synchronism with the clock signal TCLK and outputs data to a data bus line in synchronism with the clock signal RCLK. The readout data output from each memory module to the data bus line is input to the controller MEC.

Data to be written in each memory module is output from the controller to the data bus line. Each memory module receives the data from the data bus line in synchronism with the clock signal TCLK and writes the data in it. In addition to a clock bus line for transferring the clock signals TCLK and RCLK, the command bus line for transferring commands, and the data bus line for transferring data, this memory board system has an address bus line for transferring address signals. This address bus line is not shown in FIG. 1.

Each memory module generates two different internal clock signals synchronizing with the clock signals TCLK and RCLK and controls data read and write in synchronism with these two internal clock signals. A circuit for generating such internal clock signals is proposed as a Synchronous Adjustable Delay (SAD) in U.S. Ser. No. 08/839037 filed by the present inventor.

In the system shown in FIG. 1, the condition under which data transfer is normally performed is that the clock signals TCLK and RCLK transferred through the clock bus line and data transferred through the data bus line synchronize with each other at any instant. However, this condition is difficult to completely meet. This is so because it is difficult to completely equalize the physical conditions, e.g., the resistances and capacitances of the clock bus line for transferring the clock signals, the data bus line for transferring data, and the command bus line for transferring commands.

For this reason, even when one of the memory modules outputs data to the data bus line in synchronism with the clock signal RCLK, the clock signal RCLK and the data arrive at the controller with a slight time difference. This time difference naturally changes in accordance with the position of a memory module which outputs data. If a cycle time of the clock signal is much longer than this time difference, the controller can have a sufficiently long data window, i.e., data input period. So, this time difference is not a problem.

If the cycle time of the clock signal shortens, however, the time difference between the clock signal RCLK and data arriving at the controller is a problem. If this is the case, therefore, the physical conditions, e.g., the resistances of the clock bus line and the data bus line must be made as equal as possible to thereby decrease the time difference and perform high-speed data transfer.

Unfortunately, the degree of freedom of the memory system is lost when the above method is used. This will be described below with reference to FIGS. 2A and 2B.

FIG. 2A shows the arrangement of a memory board system including one controller MEC and three memory modules MM1 to MM3. FIG. 2B shows the arrangement of a memory board system including one controller MEC and four memory modules MM1 to MM4. The load conditions of the memory modules with respect to a clock bus line and data bus line are not necessarily the same. Accordingly, if the physical conditions of the clock bus line and data bus line are matched in one of the two systems, the conditions in the other system may differ from the matched conditions.

For example, assume that a signal propagates from the memory module MM3 to the controller MEC while the bus conditions are matched in the system shown in FIG. 2B. FIG. 3A shows the relationship between the timings of the clock signal RCLK and data at the position of the memory module MM3. in the systems shown in FIGS. 2A and 2B. FIG. 3B shows the relationship between the timings of the clock signal RCLK and data at the position of the controller MEC in the systems shown in FIGS. 2A and 2B.

The bus conditions are matched in the system shown in FIG. 2B. Therefore, in the system shown in FIG. 2B, the clock signal RCLK and data synchronize with each other at the position of the memory module MM3, as shown in FIG. 3A. In contrast, in the system shown in FIG. 2A, a bus delay time with respect to the clock signal RCLK is different. Accordingly, as shown in FIG. 3B, the clock signal RCLK and data do not synchronize with each other at the position of the controller MEC. For example, if the position of data moves as indicated by the thick lines in FIG. 3B, the controller can no longer receive the data at the timing of the leading edge of the clock,.signal RCLK.

Next, the influence of the characteristics of a bus line on a signal delay time will be described below. In an ideal case, if a signal line has a capacitance C and an inductance L per unit length (cm), a signal propagates the unit length for a time of $(C \cdot L)^{1/2}$. In a general memory board system, if C is 5 to 7 pF and L is 15 to 20 nH, a signal delay time per unit length is 0.27 to 0.37 nS. Therefore, a variation in the signal delay time per unit length is (0.37–0.27) nS=0.1 nS. If the length of the whole memory module is 10 cm, a variation in the signal delay time in the whole memory module is 1 nS. This means that even if timings in bus lines are optimized in a specific system constructed of a controller and some memory modules, a signal delay time is shifted about 1 nS in another system having a different number of memory modules.

If a data window, i.e., a data input period equivalent to this time variation is required, a clock signal cycle of 2 ns, in other words, a clock signal frequency of 500 MHz is the limit by which data transfer can be normally performed without strictly equalizing the physical conditions of bus lines. Note that a command is input in, e.g., every other cycle, rather than each cycle, with respect to the clock signal TCLK. That is, the timing of a command can be loosely defined compared to that of data. So, the same synchronism with the clock signal as that of data is unnecessary.

As described above, in the conventional memory board system including a plurality of memory modules and one memory controller, if the cycle of a clock signal shortens in order to increase the data transfer rate, no normal operation can be performed any longer depending on the position of a memory module along a bus line or on the environment of a bus system.

BRIEF SUMMARY OF THE INVENTION

It is, therefore, an object of the present invention to provide a high-speed data transfer synchronizing system and high-speed data transfer synchronizing method capable of high-speed synchronous data transfer without very strictly limiting the physical conditions of bus lines between memory modules and a memory controller.

According to the present invention, there is provided a high-speed data transfer synchronizing system comprising a plurality of memory modules for receiving a clock signal to operate in synchronism with the clock signal, each of the memory modules having at least one internal clock signal generating circuit to generate at least one internal clock signal synchronizing with the clock signal from the clock signal and having a function of adjusting a generation timing of the internal clock signal and a memory controller for generating and supplying the clock signal to the memory modules and transferring/receiving data to/from the memory modules.

According to the present invention, there is provided a clock signal generating circuit comprising a first buffer circuit for receiving an external clock signal, a first delay circuit having a signal delay time substantially equal to a signal delay time in the first buffer circuit, the first delay circuit receiving an output signal from the first buffer circuit and delaying the output signal from the first buffer circuit, a second delay circuit for receiving an output signal from the first delay circuit and delaying the output signal from the first delay circuit by a predetermined time, a second buffer circuit for receiving an output signal from the second delay circuit, a third delay circuit comprising a plurality of cascaded multi-stage first delay units to receive an output signal from the second buffer circuit and delay the output signal from the second buffer circuit, by transmitting the signal by the plurality of first delay units, for a period corresponding to a cycle of the clock signal, a fourth delay circuit comprising a plurality of cascaded multi-stage second delay units to receive the signal delayed by the third delay circuit and delay the delayed signal by transmitting the signal by the same number of second delay units as the number of first delay units by which. the output signal from the second buffer circuit is transmitted, a variable delay circuit for receiving an output signal from the fourth delay circuit and outputting the output signal from the fourth delay circuit after delaying the signal by a time corresponding to a control signal, and a third buffer circuit having a signal delay time substantially equal to a signal delay time in the second buffer circuit, the third buffer circuit receiving an output signal from the variable delay circuit and generating an internal clock signal.

According to the present invention, there is provided a high-speed data transfer synchronizing method for a high-speed data transfer synchronizing system comprising a plurality of memory modules for receiving a clock signal to operate in synchronism with the clock signal, each of the memory modules having an internal clock signal generating circuit to generate at least one internal clock signal synchronizing with the clock signal from the clock signal and having a function of adjusting a generation timing of the internal clock signal and a memory controller for generating and supplying the clock signal to the memory modules and transferring/receiving data to/from the memory modules, and comprising the steps of storing a predetermined data pattern in the memory modules, reading out the data pattern stored in each memory module from the memory modules and transferring the readout data pattern to the memory controller, and comparing the data pattern transferred from each memory module with the original predetermined data pattern and generating the control signal such that the two data patterns match.

According to the present invention, there is provided a high-speed data transfer synchronizing method for a high-speed data transfer synchronizing system comprising a plurality of memory modules for receiving a clock signal to operate in synchronism with the clock signal, each of the memory modules having an internal clock signal generating circuit to generate at least one internal clock signal synchronizing with the clock signal from the clock signal and having a function of adjusting a generation timing of the internal clock signal and the memory modules previously storing a predetermined data pattern, a memory controller for generating and supplying the clock signal to the memory modules and transferring/receiving data to/from the memory modules, and, comprising the steps of reading out the data pattern previously stored in each memory module and transferring the readout data pattern to the memory controller, and comparing the data pattern transferred from each memory module with the original data pattern previously stored in each memory module and generating the control signal such that the two data patterns match.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a circuit diagram showing the arrangement of a synchronous adjustable delay used in the first embodiment of the present invention;

FIG. 11 is a view showing a practical circuit configuration of a variable delay circuit in the synchronous adjustable delay shown in FIG. 10;

FIG. 12 is a circuit diagram showing a practical arrangement of a switching circuit formed in the variable delay circuit shown in FIG. 11;

FIGS. 40A and 40B are circuit diagrams of a control signal generating circuit for generating control signals Fo and Fe used in the circuit shown in FIG. 39;

FIG. 41 is a view showing a practical circuit configuration of a forward delay when a small block of the forward delay is constructed of one delay unit and jitters contained in an external clock signal are averaged over four cycles in the third embodiment;

FIG. 42 is a view showing a practical circuit configuration of a forward delay when a small block of the forward delay is constructed of one delay unit and jitters contained in an external clock signal are averaged over four cycles in the third embodiment;

FIG. 43 is a circuit diagram showing a state holding circuit and its control circuit when jitters contained in an external clock signal are averaged over four cycles in the third embodiment; and FIGS. 44A, 44B, and 44C are circuit diagrams of control signal generating circuits for generating control signals Fa, Fb, Fc, and Fd used in the circuit shown in FIG. 43.

DETAILED DESCRIPTION OF THE INVENTION

First, the principle of a high-speed data transfer synchronizing system and high-speed data transfer synchronizing method according to the present invention will be described below.

The system of the present invention is a memory board system including one controller and a plurality of memory modules. To allow synchronous transfer control of data by using a clock signal having a frequency of, e.g., 500 MHz or more without strictly restricting the physical conditions of bus lines, each memory module generates internal clock signals synchronizing with external clock signals. A predetermined delay time is added to or subtracted from each internal clock signals, thereby adjusting the timing of the internal clock signals. By using the internal clock signals whose timings are adjusted, data read and write timings are adjusted in each memory module.

Figures 3A, 3B:
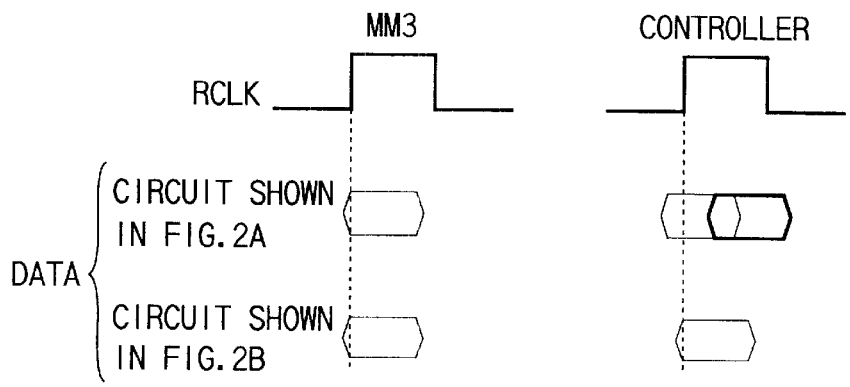
FIGS. 3A and 3B are timing charts showing examples of operation timings in the memory;board systems shown in FIGS. 2A and 2B.

With this arrangement, the memory controller is not influenced by the difference between the timings of data and a clock signal RCLK resulting from the difference between the numbers of memory modules as shown in FIG. 3B.

This principle of the present invention will be described in more detail below.

Figure 1:
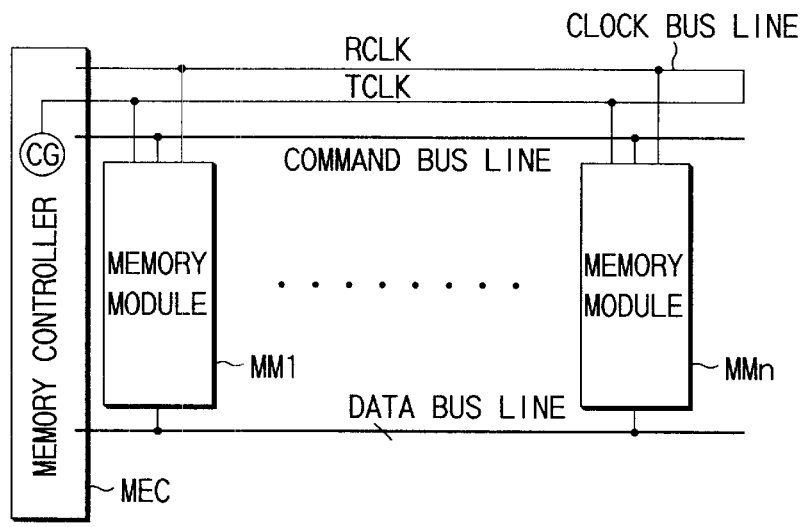
FIG. 1 is a block diagram showing an outline of the arrangement of a memory board system.
Figure 2A:
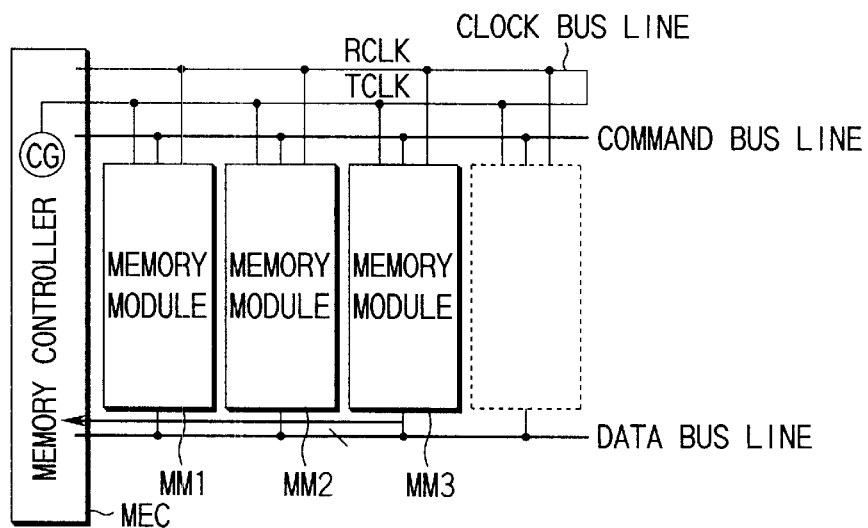
FIGS. 2A and 2B are block diagrams showing memory board systems having different arrangements.
Figure 2B:
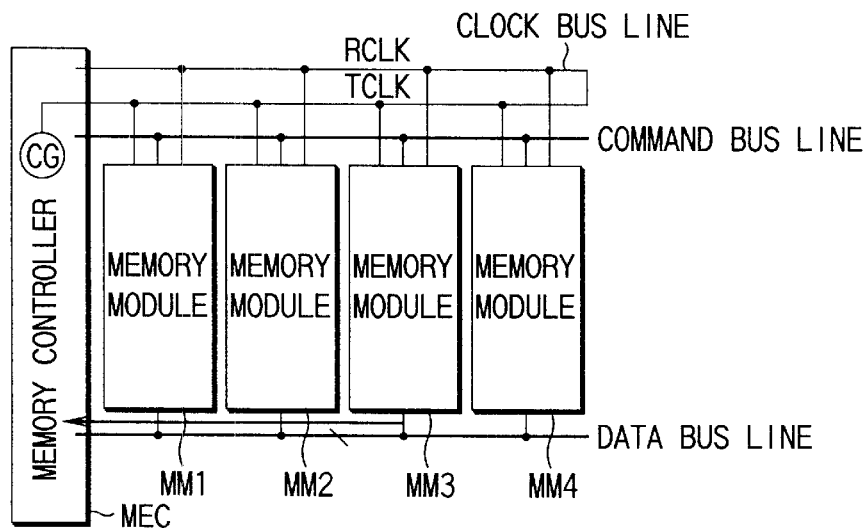
Figure 4:
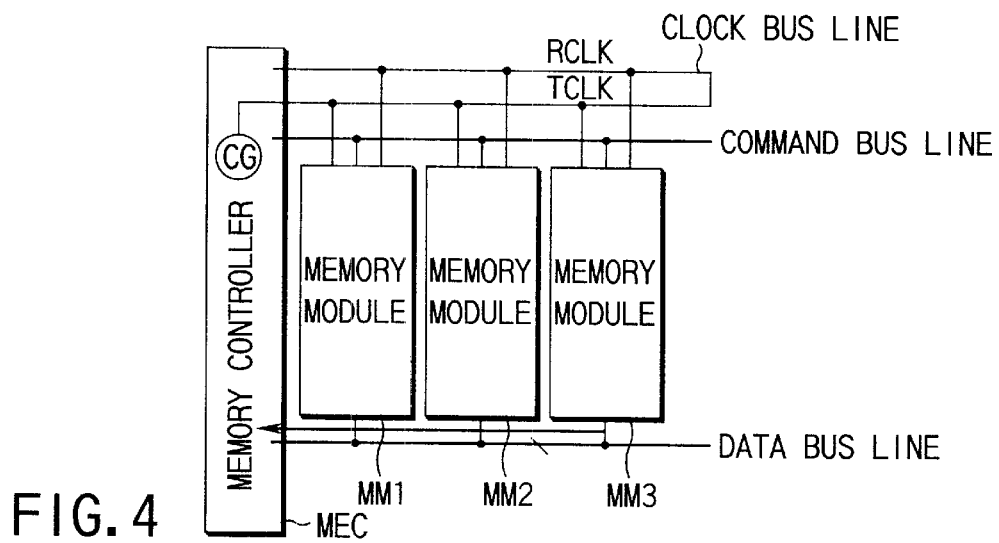
FIG. 4 is a block diagram showing an outline of the arrangement of a memory board system used to explain the principle of the present invention.
Figures 5A, 5B:
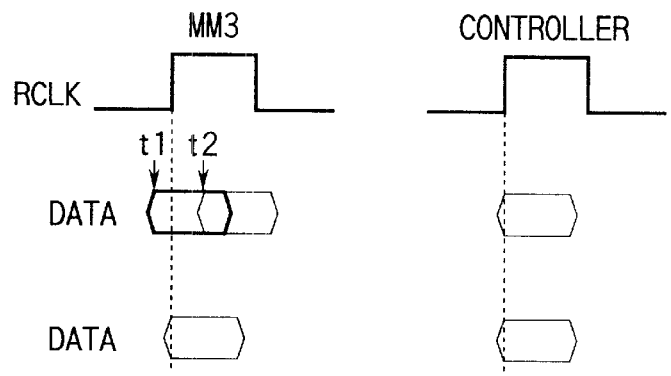
FIGS. 5A and 5B are timing charts of the memory board system shown in FIG. 4.

FIG. 4 shows the arrangement of a memory board system, like the memory board system shown in FIG. 1, which includes one controller MEC and three memory modules MM1 to MM3 connected through a clock bus line, data bus line, and command bus line. FIGS. 5A and 5B are timing charts showing some signals in this memory board system.

If data arriving at the controller delays from the clock signal RCLK as indicated by the thick lines in FIG. 3B, a memory module for sending data, e.g., the memory module MM3 is made to output data at a timing (time t1 in FIG. 5A) earlier than the clock signal RCLK. Also, if the timing at which data arrives at the controller is early as indicated by the solid lines in FIG. 3B, a memory module for sending data is made to output data at a timing (time t2 in FIG. 5B) later than the clock signal RCLK.

As described above, the timing at which a memory module outputs data is adjusted in accordance with the timing at which data arrives at the controller. Consequently, data always arrives at the controller in synchronism with the clock signal RCLK. This realizes reliable high-speed data transfer between the memory modules and the controller.

In the present invention, the timing adjustment as described above is performed for each memory module, and this timing adjustment is done by using the synchronous adjustable delay described previously.

This synchronous adjustable delay described in the specification and views according to U.S. Ser. No. 08/839037 cited earlier will be described below.

Figure 6A:
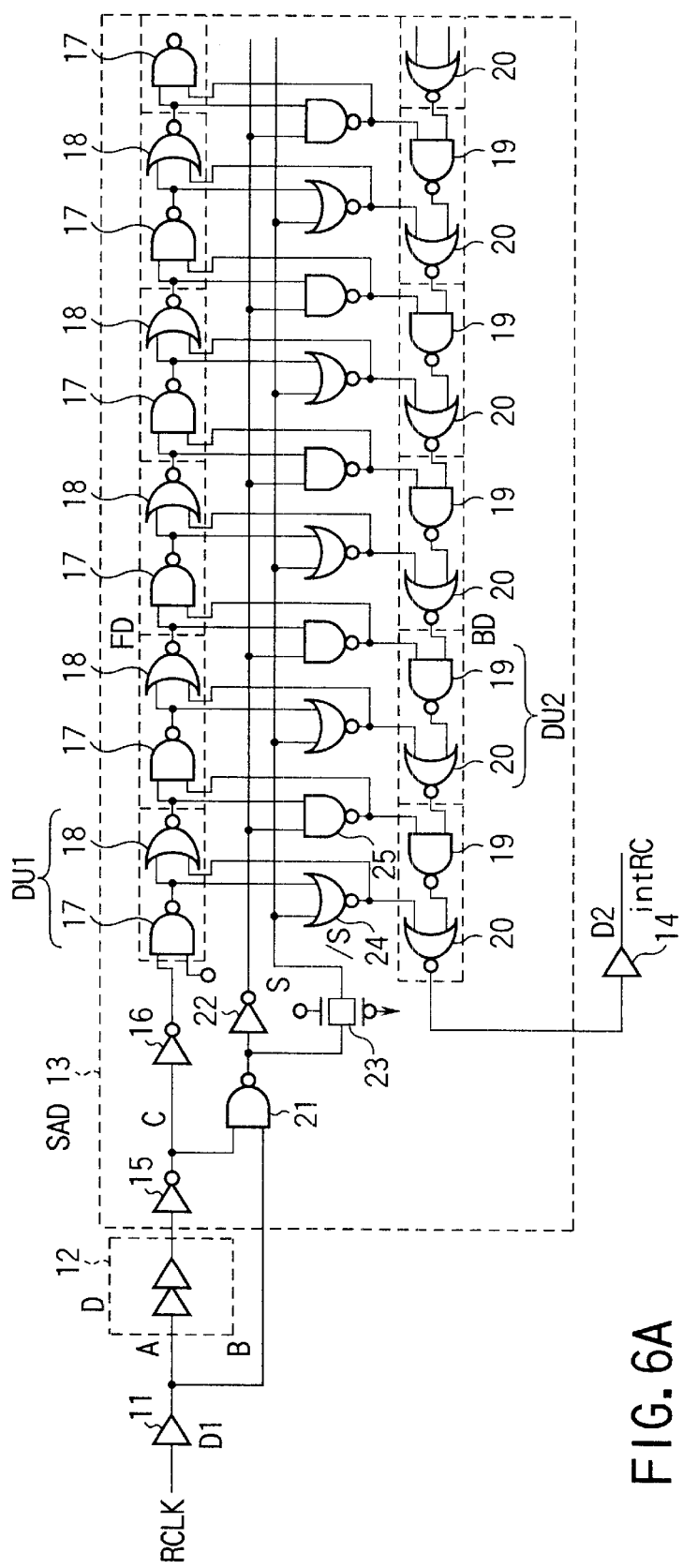
FIG. 6A is a circuit diagram of a synchronous adjustable delay.
Figure 6B:
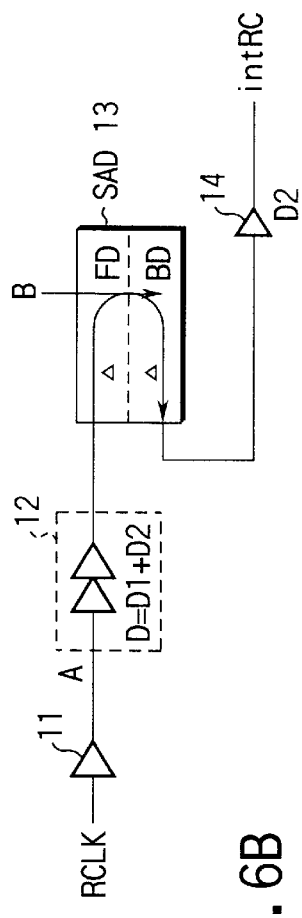
FIG. 6B is a circuit diagram expressing the synchronous adjustable delay shown in FIG. 6A by using symbols.

FIGS. 6A and 6B show the synchronous adjustable delay and an I/O buffer circuit for inputting and outputting signals with respect to this synchronous adjustable delay. FIG. 6A expresses the circuit configuration on a logic gate level. FIG. 6B expresses the circuit configuration by using symbols. The same reference numerals denote the same parts in FIGS. 6A and 6B.

The synchronous adjustable delay shown in FIGS. 6A and 6B generates an internal clock signal intRC from an external clock signal RCLK. A synchronous adjustable delay for generating an internal clock signal intTC from another external clock signal TCLK has the same arrangement, so a detailed description thereof will be omitted.

An input buffer circuit 11 having a delay time D1 receives the external clock signal RCLK. A delay circuit 12 including two buffer circuits connected in series receives an output signal A from the input buffer circuit 11 and supplies an output signal to a synchronous adjustable delay 13. This delay circuit 12 has a delay time D (=D1+D2). An output buffer circuit 14 receives an output signal from the synchronous adjustable delay 13 and generates the internal clock signal intRC. This output buffer circuit 14 has a delay time D2. Note that the output signal A from the input buffer circuit 11 is also supplied as a signal B to the synchronous adjustable delay 13.

The synchronous adjustable delay 13 incorporates two inverter circuits 15 and 16 connected in series, a plurality of cascaded multi-stage delay units DU1, cascaded multi-stage delay units DU2 equal in number to the delay units DU1, a NAND gate circuit 21, an inverter circuit 22, a pass gate circuit 23, NOR gate circuits 24, and NAND gate circuits 25. Each of the delay units DU1 includes a NAND gate circuit 17 and a NOR gate circuit 18 one input terminal of which receives an output signal from the NAND gate circuit 17. Each of the delay units DU2 includes a NAND gate circuit 19 and a NOR gate circuit 20 one input terminal of which receives an output signal from the NAND gate circuit 19. The NAND gate circuit 21 receives an output signal C from the inverter circuit 15 and the output signal B from the input buffer circuit 11. The inverter circuit 22 inverts an output signal from the NAND gate circuit 21 and outputs a control signal S. The pass gate circuit 23 so delays that a delay time from the input signal B is essentially equal in order to match the timing with the output signal S from the inverter circuit 22. Each NOR gate circuit 24 and each NAND gate circuit 25 are inserted between the delay unit DU1 and the delay unit DU2.

The cascaded multi-stage delay units DU1 construct a forward delay FD. Likewise, the cascaded multi-stage delay units DU2 construct a backward delay BD.

The NOR gate circuit 24 and the NAND gate circuit 25 transmit a signal delayed by the forward delay FD to the backward delay BD at the timing of the leading edge of the signal B. The NOR gate circuit 24 receives a control signal /S and an output signal from the NAND gate circuit 17 in the corresponding delay unit DU1. The NOR gate circuit 24 supplies an output signal to the NOR gate circuit 20 in the corresponding delay unit DU2. The NAND gate circuit 25 receives the control signal S and an output signal from the NOR gate circuit 18 in the corresponding delay unit DU1. The NAND gate circuit 25 supplies an output signal to the NAND gate circuit 19 in the corresponding delay unit DU2.

The operation of the synchronous adjustable delay shown in FIGS. 6A and 6B will be described below. When the external clock signal RCLK rises to HIGH level, the delay circuit 12 delays this signal by the delay amount D (=D1+

D2). After that, an output signal from the delay circuit 12 is input to the synchronous adjustable delay 13 and alternately propagates. in the NAND gates 17 and the NOR gates 18 in the forward delay FD.

The synchronous adjustable delay 13 receives the signal B for setting the timing at which a pulse signal propagated in the forward delay FD is transferred to the backward delay BD. A delay amount Δ corresponding to the time difference between the signal A and the leading edge to HIGH level of the signal B in the next cycle is detected as the leading edge to HIGH level of a pulse signal propagating in the forward delay FD (i.e., the leading edge to HIGH level of an output signal from the NOR gate circuit 18 or the trailing edge to LOW level of an output signal from the NAND gate circuit 17), and the pulse signal is moved to the backward delay BD. A movement control gate circuit for controlling the movement of this pulse signal is the circuit constructed of the NOR gate circuit 24 and the NAND gate circuit 25 inserted between the forward delay FD and the backward delay BD. Since the signals A and B are identical, a pulse signal input to the forward delay FD in an immediately preceding cycle is first moved to the backward delay BD. The NAND gate circuit 21 prevents a pulse signal input to the forward delay FD in the next cycle from moving to the backward delay BD after the delay amount D (=D1+D2).

In the synchronous adjustable delay with the above arrangement, the signal delay amount Δ in each of the forward delay FD and the backward delay BD changes in accordance with a period T of the external clock signal RCLK. This signal delay amount Δ is determined by the first and second pulses of the external clock signal RCLK. The internal clock signal intRC is formed by using this signal delay amount Δ from the second pulse. Accordingly, the internal clock signal intRC is in phase with the external clock signal RCLK from its third pulse.

Letting T be the period of the external clock signal RCLK, D+Δ=T. Therefore, the internal clock signal intRC is output T after RCLK is input, and this signal intRC synchronizes with the external clock signal RCLK.

This synchronous adjustable delay is provided for each memory module described above. This allows each memory module to generate an internal clock signal synchronizing with the external clock signal RCLK supplied to the memory module.

Note that a pulse signal delayed by the forward delay FD can move to the backward delay BD via the NAND gate circuit 17 or the NOR gate circuit 18 in any position. Accordingly, the accuracy of the timing of the obtained internal clock signal intRC corresponds to one logic gate circuit.

In this manner, the circuit shown in FIGS. 6A and 6B can generate the internal clock signal intRC, with substantially no phase difference, in synchronism with the external clock signal RCLK.

Figure 7:
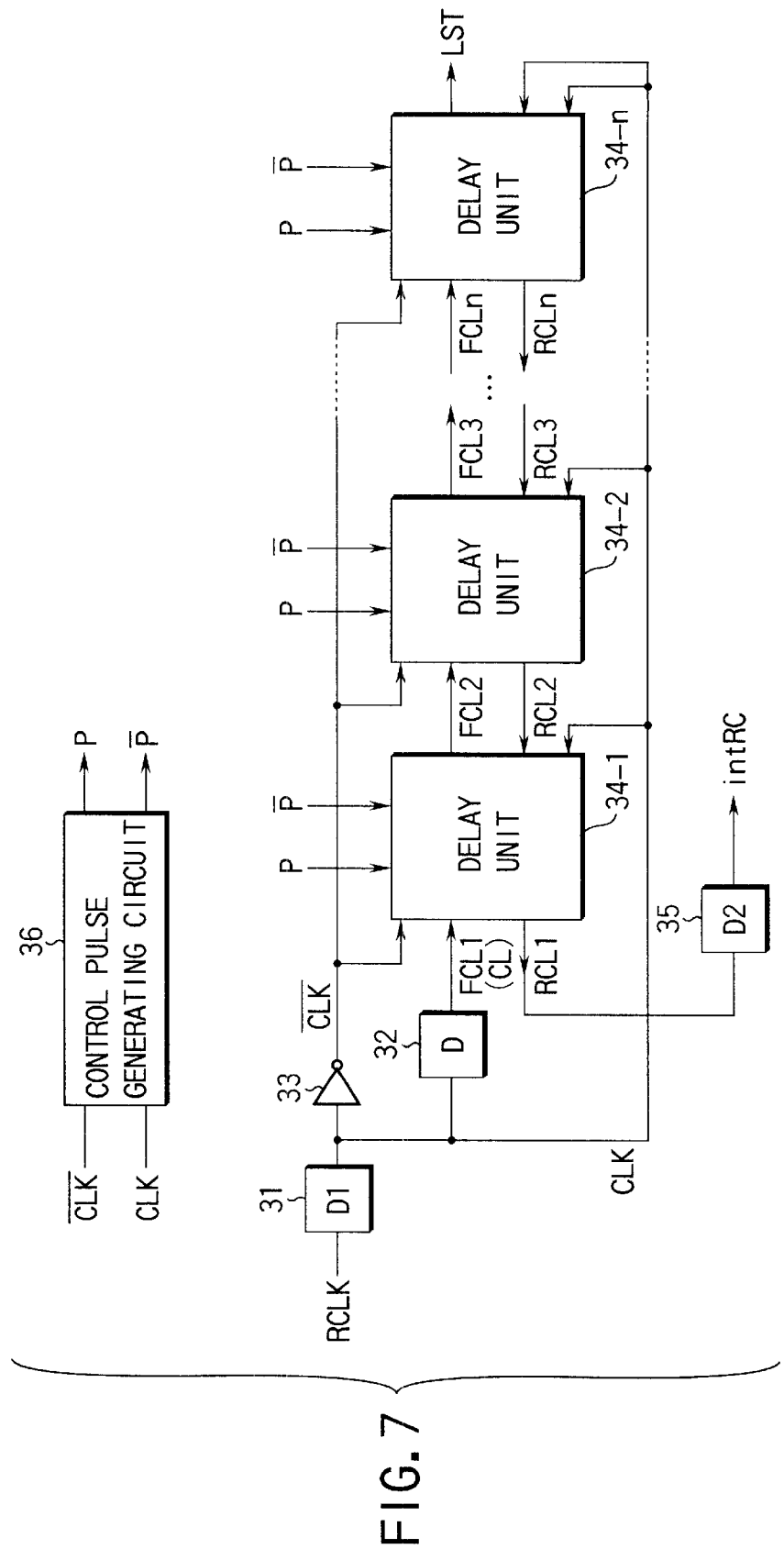
FIG. 7 is a block diagram showing the arrangement of a synchronous adjustable delay different from that shown in FIGS. 6A and 6B.

FIG. 7 is a block diagram showing a synchronous adjustable delay having a different arrangement from that shown in FIGS. 6A and 6B and an I/O buffer circuit for inputting and outputting signals with respect to this synchronous adjustable delay. This synchronous adjustable delay also generates an internal clock signal intRC from an external clock signal RCLK. A synchronous adjustable delay for generating an internal clock signal intTC from another external clock signal TCLK has the same arrangement, so a detailed description thereof will be omitted.

The external clock signal RCLK is input to an input buffer circuit 31 having a delay amount D1. This input buffer circuit 31 outputs a clock signal CLK having the skew (delay amount) D1 with respect to the external clock signal RCLK. This clock signal CLK is input to a delay circuit 32 having a delay amount D (=D1+D2). The delay circuit 32 outputs a forward pulse signal FCL1.

The clock signal CLK and a clock signal /CLK generated by inverting the clock signal CLK by an inverter circuit 33 are input in parallel to n delay units 34-1 to 34-n. These n delay units 34-1 to 34-n are cascaded to form multiple stages. The delay unit 34-1 in the first stage receives the forward pulse signal FCL1 and outputs a backward pulse signal RCL1. The output backward pulse signal RCL1 from the delay unit 34-1 in the first stage is output as the internal clock signal intRC through an output buffer circuit 35 having a delay amount D2.

The operation of each delay unit 34-i (i=1 to n) is controlled on the basis of control pulses P and /P generated by a control pulse generating circuit 36 which receives the clock signals CLK and /CLK.

Figure 8:
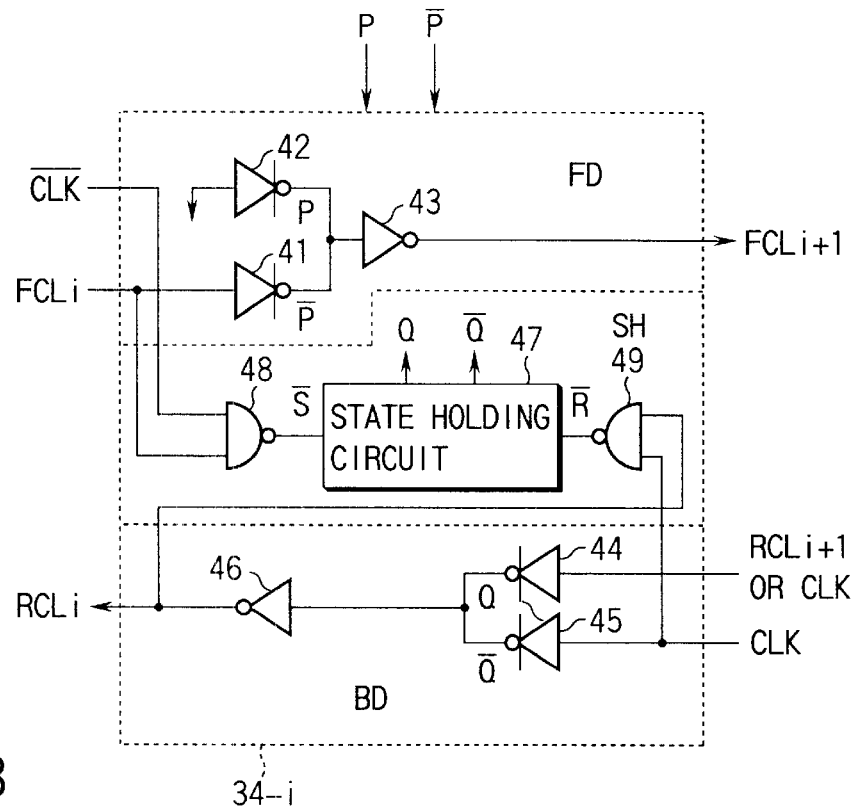
FIG. 8 is a circuit diagram showing details of the arrangement of a delay circuit in the synchronous adjustable delay shown in FIG. 7.

FIG. 8 shows details of the arrangement of each delay unit 34-i in the synchronous adjustable delay shown in FIG. 7. The delay unit 34-i is constructed of three circuits, i.e., a forward delay FD, a backward delay BD, and a sample hold circuit SH.

The forward delay FD has a delay circuit including two clocked inverter circuits 41 and 42 and one inverter circuit 43. The clocked inverter circuit 41 receives a forward pulse signal FCLi from the delay unit 34 in the preceding stage. The clocked inverter circuit 42 receives a ground potential corresponding to a logic signal of LOW level. The clocked inverter circuit 41 inverts the input forward pulse signal FCLi and outputs the inverted signal when the control pulse /P is at HIGH level. The clocked inverter circuit 42 inverts the input LOW-level signal and outputs a HIGH-level signal when the control pulse P is at HIGH level. The output nodes of these two clocked inverter circuits 41 and 42 are connected together, and this common node is connected to the input node of the inverter circuit 43. This inverter circuit 43 supplies its output signal as a forward pulse signal FCLi+1 to the delay unit 34 in the subsequent stage.

The backward delay BD has a delay circuit including two clocked inverter circuits 44 and 45 and one inverter circuit 46. The clocked inverter circuit 44 receives a backward pulse signal RCLi+1 from the delay unit 34 in the subsequent stage or the clock signal CLK. The clocked inverter circuit 45 receives the clocksignal CLK. The clocked inverter circuit 44 inverts the input backward pulse signal RCLi+1 or clock signal CLK and outputs the inverted signal when an output control pulse Q from the sample hold circuit SH is at HIGH level. The clocked inverter circuit 45 inverts the input clock signal CLK and outputs the inverted signal when an output control pulse /Q from the sample hold circuit SH is at HIGH level. The output nodes of these two clocked inverter circuits 44 and 45 are connected together, and this common node is connected to the input node of the inverter circuit 46. This inverter circuit 46 supplies its output signal as a backward pulse signal RCLi to the delay unit 34 in the preceding stage.

The sample hold circuit SH is constructed of a state holding circuit 47 and two NAND gate circuits 48 and 49. The NAND gate circuit 48 receives the forward pulse signal FCLi and the inverted clock signal /CLK from the delay unit 34 in the preceding stage. The NAND gate circuit 49 receives the backward pulse signal RCLi to the preceding stage, which is the output signal from the inverter circuit 46 in the corresponding stage, and the clock signal CLK.

The NAND gate circuit 48 supplies its output signal as a set signal IS to the state holding circuit 47. The NAND gate circuit 49 supplies its output signal as a reset signal /R to the state holding circuit 47.

In accordance with set or reset state, the state holding circuit 47 generates the control pulse Q or /Q. The control pulse Q changes to HIGH level when the state holding circuit 47 is set. The control pulse /Q changes to HIGH level when the state holding circuit 47 is reset. Details of the circuit configuration of this state holding circuit 47 will be described later.

Figure 9:
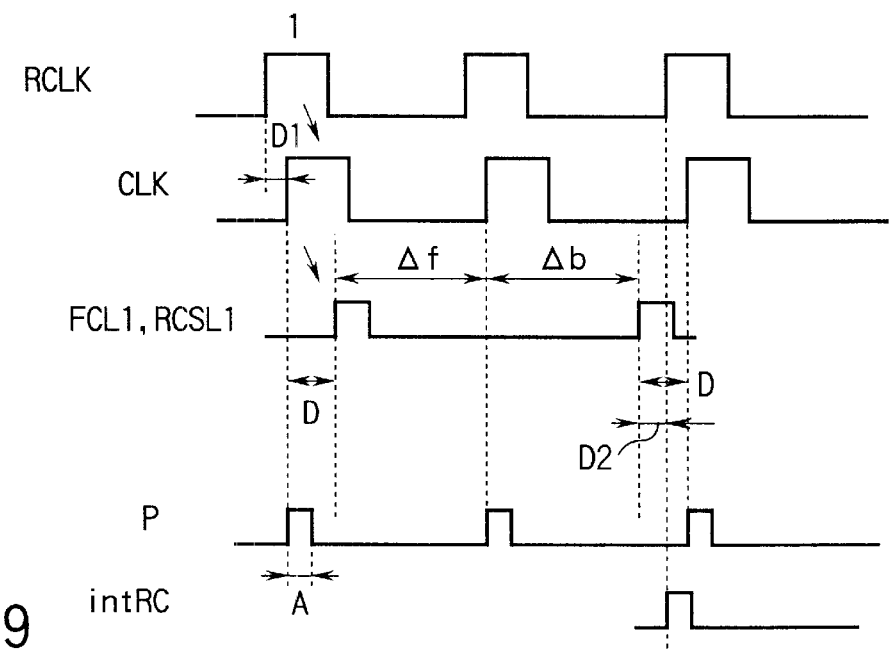
FIG. 9 is a timing chart showing an example of an operation of the synchronous adjustable delay shown in FIG. 7.

The operation of the synchronous adjustable delay shown in FIG. 7 will be described below with reference to a timing chart shown in FIG. 9. When a time D (=D1+D2) has elapsed from the generation timing of the first clock signal CLK (i.e., the timing at which the clock signal CLK rises to HIGH level), the forward pulse signal FCL1 is generated. A period from the generation timing of this forward pulse signal FCL1 to the generation timing of the second pulse of the clock signal CLK is Δf.

A period Δb is formed by copying this period Δf. A backward pulse signal is generated when a period 2Δ (Δ=Δf=Δb) has elapsed from the generation timing of the forward pulse signal FCL1. Consequently, the timing at which the delay amount D has elapsed from the generation timing of the backward pulse signal RCL1 matches the timing at which the third pulse of the clock signal CLK rises to HIGH level.

Let D2 be a period from the generation timing of the pulse signal RCL1 to the generation timing of the third external clock signal RCLK. If this is the case, the internal clock signal intRC timing with the external clock signal RCLK is obtained by delaying D1+D+2Δ+D2=2T.

The control pulse signals P and /P are used to initialize the backward delays BD in all delay units before the forward pulse signal FCLi is input to the delay unit in the first stage. That is, the control pulse signals P and /P are used to operate the clocked inverter circuit 42 to set the signal at the input node of the inverter circuit 43 to HIGH level.

In the high-speed data transfer synchronizing system and high-speed data transfer synchronizing method according to the present invention, each memory module generates an internal clock signal synchronizing with an external clock signal, and data is input or output by using this internal clock signal. In inputting or outputting data, a predetermined delay is added to or subtracted from the internal clock signal to adjust the data input or output timing. For this purpose, a synchronous adjustable delay as shown in FIG. 10 is used.

The synchronous adjustable delay shown in FIG. 10 has a function of controlling the data input or output timing in addition to the functions of the synchronous adjustable delay shown in FIGS. 6A and 6B. The synchronous adjustable delay shown in FIG. 10 generates an internal clock signal intRC from an external clock signal RCLK. However, a synchronous adjustable delay for generating an internal clock signal intTC from another external clock signal TCLK has the same arrangement, so a detailed description thereof will be omitted.

The synchronous adjustable delay shown in FIG. 10 used in the system of the first embodiment of the present invention is different from the synchronous adjustable delay shown in FIGS. 6A and 6B in two points: a delay circuit 26 is used in place of the delay circuit 12 having the delay time D (=D1+D2) shown in FIGS. 6A and 6B in order to adjust the timing of an internal clock signal, and a delay circuit 27 is arranged instead of the output buffer circuit 14 shown in FIGS. 6A and 6B. Since the rest of the configuration is identical with that shown in FIGS. 6A and 6B, only the differences from FIGS. 6A and 6B will be explained below.

The delay circuit 26 includes a buffer circuit 51 having a delay time D1, a variable delay circuit 52, a buffer circuit 53 having a delay time D2, and a buffer circuit 54 having the delay time D2. The variable delay circuit 52 receives an output signal supplied from the buffer circuit 51, delays it by a predetermined time d0, and outputs a first delayed output signal. The variable delay circuit 52 also delays the output signal from the buffer circuit 51, by a time d0 equal to the fixed delay time d0, and outputs a second delayed output signal. The buffer circuit 53 receives the second delayed output signal from the variable delay circuit 52. The buffer circuit 54 receives the first delayed output signal from the variable delay circuit 52. The buffer circuit 53 supplies its output signal to a forward delay FD of a synchronous adjustable delay 13.

The delay circuit 27 includes a variable delay circuit 55, a buffer circuit 56 having the delay time D2, and a buffer circuit 57 having the delay time D2. The variable delay circuit 55 delays an output signal from the synchronous adjustable delay 13 by the predetermined time d0 and outputs a first delayed output signal. The variable delay circuit 55 also outputs a second delayed output signal whose delay time is increased or decreased by d with respect to the fixed delay time d0 by external control. The buffer circuit 56 receives the second delayed output signal from the variable delay circuit 55. The buffer circuit 57 receives the first delayed output signal from the variable delay circuit 55. The buffer circuits 56 and 57 supply their output signals as internal clock signals intRC' and intRC, respectively, synchronizing with the external clock signal RCLK.

In the variable delay circuit 52 of the delay circuit 26, the delay time of both the first and second delayed output signals is the predetermined time d0, so no specific arrangement for changing the delay time is necessary. However, since the delay circuit 27 also has the variable delay circuit 55 similar to the variable delay circuit 52, the variable delay circuit 52 is used to obtain substantially the same circuit conditions as this variable delay circuit 55. For the same reason as above, the buffer circuit 54 of the delay circuit 26 can be omitted because an output signal from this buffer circuit 54 is not supplied to any other circuit. However, the buffer circuit 57 is connected to the variable delay circuit 55 to obtain the internal clock signal intRC. So, the buffer circuit 54 is connected to the variable delay circuit 52 to obtain substantially the same load conditions as for the variable delay circuit 55.

The basic operation of the synchronous adjustable delay with the above arrangement is similar to that of the synchronous adjustable delay shown in FIGS. 6A and 6B. Since T=D+Δ=D1+d0+D2+Δ, a total delay time in a signal path from the external clock signal RCLK to the internal clock signal intRC' is D1+Δ+d0±d+D2=T±d. That is, the internal clock signal having a timing shifted d from the external clock signal RCLK can be generated. Note that the delay time of the output internal clock signal intRC from the buffer circuit 57 is output through a pass having the delay time d0. Therefore, this internal clock signal intRC is in phase with the external clock signal RCLK.

The variable delay circuits 52 and 55 vary their delay times in accordance with an external control signal. FIG. 11 shows a practical circuit configuration.

In this circuit, n unit delay elements 61 are connected in series, and signals are selectively extracted from their series-connected nodes. A plurality of switching circuits 62 are used to extract signals from these series-connected nodes. These switching circuits 62 are constructed of one switching circuit 62-1 for selecting the first delayed output signal delayed by the predetermined time d0 and a plurality of switching circuits 62-2 for selecting the second delayed output signal whose delay time is increased or decreased by d with respect to d0.

Each of the switching circuits 62-1 and 62-2 is constructed as shown in FIG. 12. That is, each of these switching circuits 62-1 and 62-2 has a CMOS clocked inverter circuit 67 including two p-channel MOS transistors 63 and 64 and two n-channel MOS transistors 65 and 66, and a CMOS inverter circuit 70 including a p-channel MOS transistor 68 and an n-channel MOS transistor 69.

The p-channel MOS transistors 63 and 64 and n-channel MOS transistors 65 and 66 constructing the clocked inverter circuit 67 are connected in series between a power source potential supply node and a ground potential supply node. The gates of the transistors 64 and 65 receive a signal from the corresponding series-connected node of the unit delay element 61. The gate of the transistor 63 receives a control signal /Tapi (i=0 to n). The gate of the transistor 66 receives a control signal Tapi. This clocked inverter circuit 67 inverts an input signal and outputs the inverted signal to the inverter circuit 70 when the control signal /Tapi is at LOW level and the control signal Tapi is at HIGH level.

The switching circuit 62-1 for outputting the first delayed output signal is connected to a series-connected node at which a delay amount d0 which is substantially half the maximum delay amount in the whole circuit is obtained. This switching circuit 62-1 constantly receives a LOW-level signal as a signal corresponding to the control signal /Tapi and a HIGH-level signal as a signal corresponding to the control signal Tapi. Accordingly, the switching circuit 62-1 constantly operates to select and output a signal from the unit delay element 61 connected to this switching circuit 62-1. A delay time from an input signal in to one end of the n series-connected unit delay elements 61 to the output node (fixed out) of this switching circuit 62-1 corresponds to d0 shown in FIG. 10.

Also, only one of the switching circuits 62-2 for outputting the second delayed output signal receives a LOW-level signal as the control signal /Tapi and a HIGH-level signal as the control signal Tapi. A signal at a series-connected node to which this switching circuit 62-2 receiving the control signals is connected is selected and output as the second delayed output signal (out). A delay time from the input signal in to the output node of this switching circuit 62-2 corresponds to d0±d shown in FIG. 10.

As described above, one of the switching circuits 62-2 operates on the basis of the control signals /Tapi and Tapi to select a signal delayed by the unit delay element 61.

Figure 13:
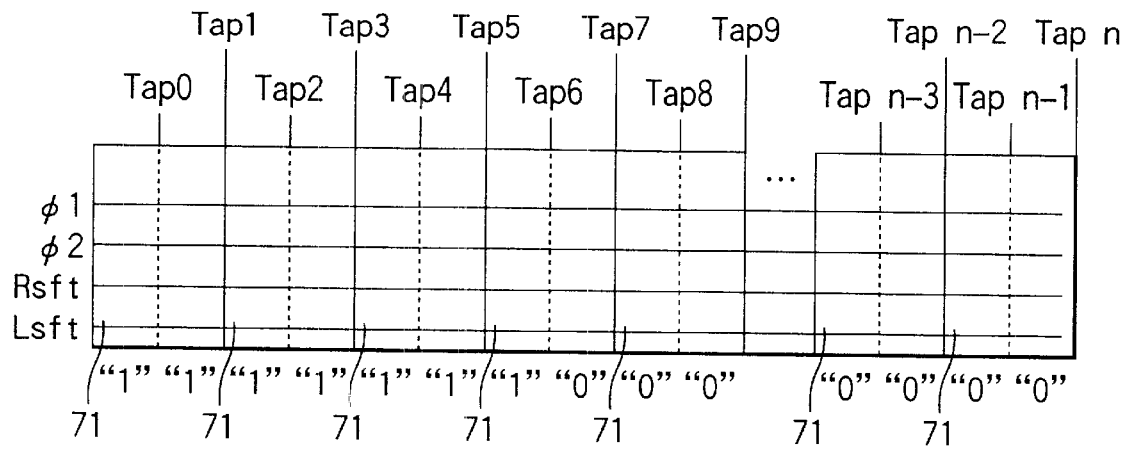
FIG. 13 is a block diagram showing the configuration of a control signal generating circuit for generating a control signal used to control the switching circuit shown in FIG. 12.

FIG. 13 shows the configuration of a control signal generating circuit for generating the control signals /Tapi and Tapi used to control the switching circuits 62-2.

In the circuit shown in FIG. 13, a plurality of circuit units 71 each including two register circuits are arranged. Each circuit unit 71 outputs two pairs of continuous complementary control signals Tapi and Tapi-1, and /Tapi and /Tapi-1 (/Tapi and /Tapi-1 are not shown in FIG. 13). These circuit units 71 receive two different sync signals φ1 and φ2, a right shift signal Rsft, and a left shift signal Lsft.

"1" or "0" printed below each circuit unit 71 indicates the storage state of each of the two register circuits in the circuit unit 71. Only the control signal Tapi in the boundary between "1" and "0" changes to HIGH level. For example, referring to FIG. 13, the storage states of the two register circuits in the fourth circuit unit 71 from the left are "1" and "0". So, a control signal Tap6 corresponding to this boundary changes to HIGH level.

In the initial state, the two register circuits in each circuit unit 71 are so set that the control signal Tapi to be supplied to the switching circuit 62-2 in a position "m" in FIG. 11 changes to HIGH level. After the setting, "1" or "0" of each register circuit is shifted right or left by one register circuit on the basis of the sync signals φ1 and φ2 and the right shift signal Rsft or the left shift signal Lsft.

The sync signals φ1 and φ2 are pulse signals which alternately rise. When at HIGH level, the right shift signal Rsft and the left shift signal Lsft shift "1" or "0" of each register circuit to the right or left, respectively, by one register circuit in accordance with the sync signal φ1 or φ2.

Figure 14:
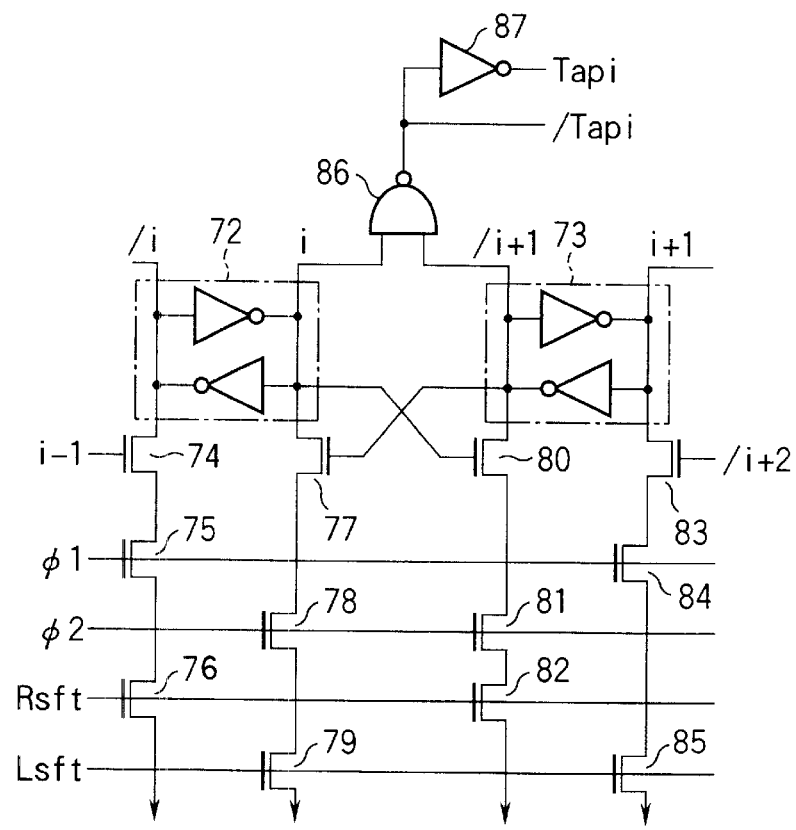
FIG. 14 is a circuit diagram showing details of the circuit configuration of one circuit unit in FIG. 13.

FIG. 14 shows details of the circuit configuration of one unit circuit 71 shown in FIG. 13. Referring to FIG. 14, reference numerals 72 and 73 denote the aforementioned register circuits each constructed by antiparallel-connecting the input and output terminals of two inverter circuits. Output signals from the register circuit 71 are called /i and i, and output signals from the register circuit 73 are called /i+1 and i+1. Three n-channel MOS transistors 74 to 76 are connected in series between the output signal /i from the register circuit 72 and a ground potential supply node. Three n-channel MOS transistors 77 to 79 are connected in series between the other output signal i from the register circuit 72 and the ground potential supply node. Three n-channel MOS transistors 80 to 82 are connected in series between the output signal /i+1 from the register circuit 73 and the ground potential supply node. Three n-channel MOS transistors 83 to 85 are connected in series between the other output signal i+1 from the register circuit 73 and the ground potential supply node.

The gates of the transistors 74 to 76 receive an output signal i−1 from the register circuit 73 in the circuit unit 71 in the immediately preceding stage, the sync signal φ1, and the right shift signal Rsft. The gates of the transistors 77 to 79 receive the output signal /i+1 from the register circuit 73 in the same circuit unit 71, the sync signal φ2 and the left shift signal Lsft. The gates of the transistors 80 to 82 receive the output signal i from the register circuit 72 in the same circuit unit 71, the sync signal φ2, and the right shift signal Rsft. Analogously, the gates of the transistors 83 to 85 receive the output signal /i+2 from the register circuit 72 in the circuit unit 71 in the immediately succeeding stage, the sync signal φ1, and the left shift signal Lsft.

The output signal i from the register circuit 72 and the output signal /i+1 from the register circuit 73 are input to the NAND gate circuit 86. This NAND gate circuit 86 outputs the control signal /Tapi. This control signal /Tapi is supplied to the inverter circuit 87, and the inverter circuit 87 outputs the control signal Tapi.

In the immediately preceding circuit unit 71 of the circuit unit 71 shown in FIG. 14, control signals Tapi−1 and /Tapi−1 are generated by using the output signal /i from the register circuit 72 and the output signal i−1 from the register circuit 73 in this circuit unit 71. In the immediately succeeding circuit unit 71 of the circuit unit 71 shown in FIG. 14, control signals Tapi+1 and /Tapi+1 are generated by using the output signal i+1 from the register circuit 73 and the output signal /i+2 from the register circuit 72 in this circuit unit 71.

The operation of the circuit unit 71 shown in FIG. 14 will be described below. Assume that all signals up to the output signal i from the register circuit are at HIGH level, and the output signal i+1 from the register circuit is at LOW level. Since the two input signals to the NAND gate circuit 86 are at HIGH level, the control signal /Tapi as the output signal from this NAND gate circuit 86 is LOW level, and the control signal Tapi as the output signal from the inverter circuit 87 is HIGH level. The other control signals Tap are at LOW level. The sync signals φ1 and φ2 alternately rise. Since the signal i is in the boundary between "1" and "0", a sync signal which rises last in the circuit shown in FIG. 14 is φ1. If the right shift signal Rsft changes to HIGH level at the next leading edge of φ2, both the transistors 81 and 82 are turned on. The transistor 80 is turned on in accordance with the output signal i (HIGH level) from the register circuit 72. The output signal /i+1 from the register circuit 73 is set to LOW level corresponding to the ground potential via three transistors 80 to 82. Consequently, the output signal i+1 from the register 73 is inverted to HIGH level, and "1" is shifted right.

Conversely, if the left shift signal Lsft changes to HIGH level at the leading edge of φ2, both the transistors 78 and 79 are turned on. The transistor 77 is turned on in accordance with the output signal /i+1 (HIGH level). The output signal i from the register circuit 72 is set to LOW level corresponding to the ground potential via three transistors 77 to 79. Consequently, the output signal i from the register circuit 72 is inverted to LOW level, and "0" is shifted left.

After the shift, the storage state of each register circuit is maintained unless the input of the sync signals φ1 and φ2 is stopped or if neither the right shift signal Rsft nor the left shift signal Lsft are input. As a consequence, the level of the set control signal Tapi is maintained. After that, the variable delay time set in the circuit shown in FIG. 11 is fixed and maintained.

Figure 15:
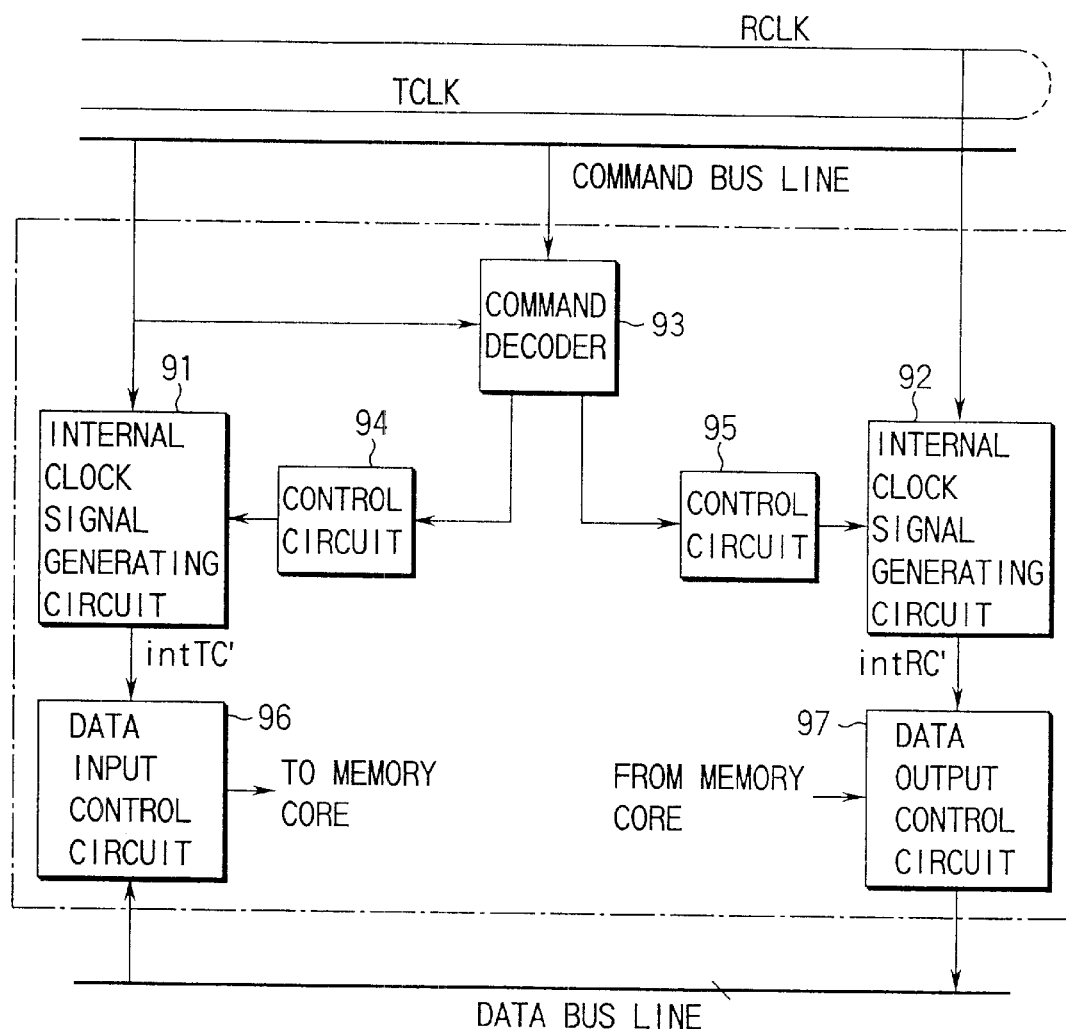
FIG. 15 is a block diagram showing the internal arrangement of a memory module used in a system according to the first embodiment of the present invention.

FIG. 15 is a block diagram showing the internal arrangement of one memory module used in the system according to the above embodiment. Note that a memory core such as a memory cell array and its peripheral circuits are not shown in FIG. 15.

An internal clock signal generating circuit 91 constructed as shown in FIG. 10 by using the synchronous adjustable delay (SAD) receives an external clock signal TCLK transferred to a clock bus line and outputs an internal clock signal intTC'. Similarly, an internal clock signal generating circuit 92 constructed as shown in FIG. 10 by using the synchronous adjustable delay receives an external clock signal RCLK transferred to the clock bus line and outputs an internal clock signal intRC'. A command decoder 93 receives the external clock signal TCLK and a command transferred to a command bus line, decodes this command, and supplies the decoded output signal to control circuits 94 and 95 for controlling operations of the two internal clock signal generating circuits 91 and 92.

These two control circuits 94 and 95 control operations including timing adjusting operations in the internal clock signal generating circuits 91 and 92 and include the control signal generating circuit shown in FIG. 13 and the like.

To write output data from a memory controller into a memory module, a data input control circuit 96 forms a data strobe signal on the basis of the output internal clock signal intTC' from the internal clock signal generating circuit 91. In synchronism with this data strobe signal, the data input control circuit 96 receives data from a data bus line and supplies the data to the memory core (not shown).

To read out data from a memory module and transfer the readout data to a memory controller, a data output control circuit 97 outputs data read out from the memory core (not shown) to the data bus line in synchronism with the output internal clock signal intRC' from the internal clock signal generating circuit 92.

In a memory module with this arrangement, the internal clock signal generating circuits 91 and 92 can individually adjust the timings of the internal clock signals intTC' and intRC' when generating these signals intTC' and intRC' from the external clock signals TCLK and RCLK. This allows a memory controller to compensate for a difference between the timings of transfer data resulting from a difference between environments such as a difference between the numbers of memory modules. Consequently, high-speed synchronous data transfer is realized.

A method of setting the delay amount in the variable delay circuit shown in FIG. 11 will be described below. This is done in the system shown in FIG. 4 by transferring predetermined burst data in synchronism with a clock signal CLK (corresponding to TCLK and RCLK) having a lower frequency than a normal operating frequency, and storing this burst data in a memory module or the memory controller.

Figure 16:
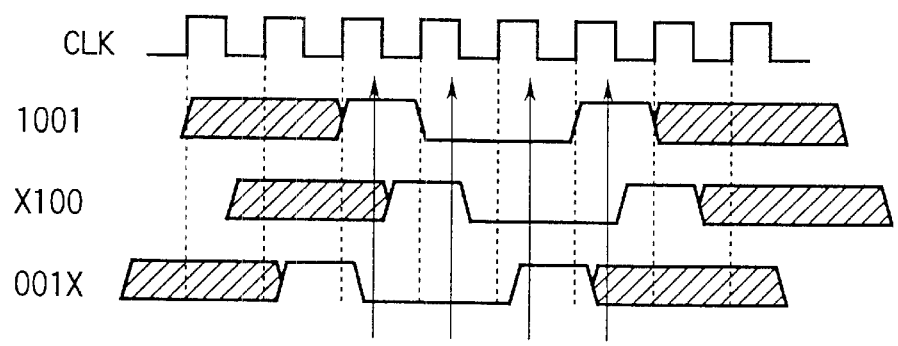
FIG. 16 is a timing chart showing an operation of transferring and storing 4-bit burst data in the first embodiment of the present invention.

FIG. 16 is a timing chart showing an operation of transferring 4-bit burst data, e.g., "1001", in synchronism with the clock signal CLK and storing the data.

If the controller is to output data in synchronism with the clock signal, this controller outputs the data at a predetermined timing in synchronism with the clock signal CLK regardless of the position of a memory module on the data bus line. If this is the case, this memory module is the data receiving side. That is, the memory module forms a data strobe signal from an internal clock signal generated on the basis of the clock signal CLK (corresponding to the clock signals TCLK and RCLK), and receives the data from the data bus line on the basis of this data strobe signal.

On the other hand, if a memory module is to output data in synchronism with the clock signal, the controller is the data receiving side. That is, the controller receives the data at a predetermined timing, regardless of the position of a memory module on the data bus line, by using a strobe signal formed from an internal clock signal synchronizing with the clock signal CLK.

In FIG. 16, the data strobe timing is indicated by the position of an upward arrow. Data "1001" is correctly input if there is no phase difference between the clock signal CLK and the data.

If the phase of data lags behind the clock signal CLK, data to be input becomes, e.g., "X100", and the loaded data is "X100". "X" means "undefined". In a case like this, a variable delay amount is set as follows. If a memory module is to load data, the control signal Tapi is set by a command from the controller such that the data strobe timing is later than an internal clock signal synchronizing with the clock signal CLK, thereby correctly loading the data as "1001".

The control signal Tapi can be set by controlling the output operations of the sync signals φ1 and φ2 and the right and left shift signals Rsft and Lsft by using a command.

If a memory module is to output data, the data must be output by further advancing the phase from the clock signal CLK. If this is the case, the control signal is set by a command from the controller such that the data output timing is earlier than an internal clock signal synchronizing with the clock signal CLK, thereby allowing the memory controller to correctly load "1001".

If the phase of data goes ahead of the clock signal CLK, data to be input becomes, e.g., "001X", and the loaded data is "001X". In a case like this, a variable delay amount is set as follows. If a memory module is to load data, the control signal Tapi is set by a command from the controller such that the data strobe timing is earlier than an internal clock signal synchronizing with the clock signal CLK, thereby correctly loading "1001".

If a memory module is to output data, the data must be output by further delaying the phase from the clock signal CLK. Therefore, the control signal Tapi is set by a command from the controller such that the data output timing is later than an internal clock signal synchronizing with the clock signal CLK, thereby allowing the controller to correctly load "1001".

Figure 17:
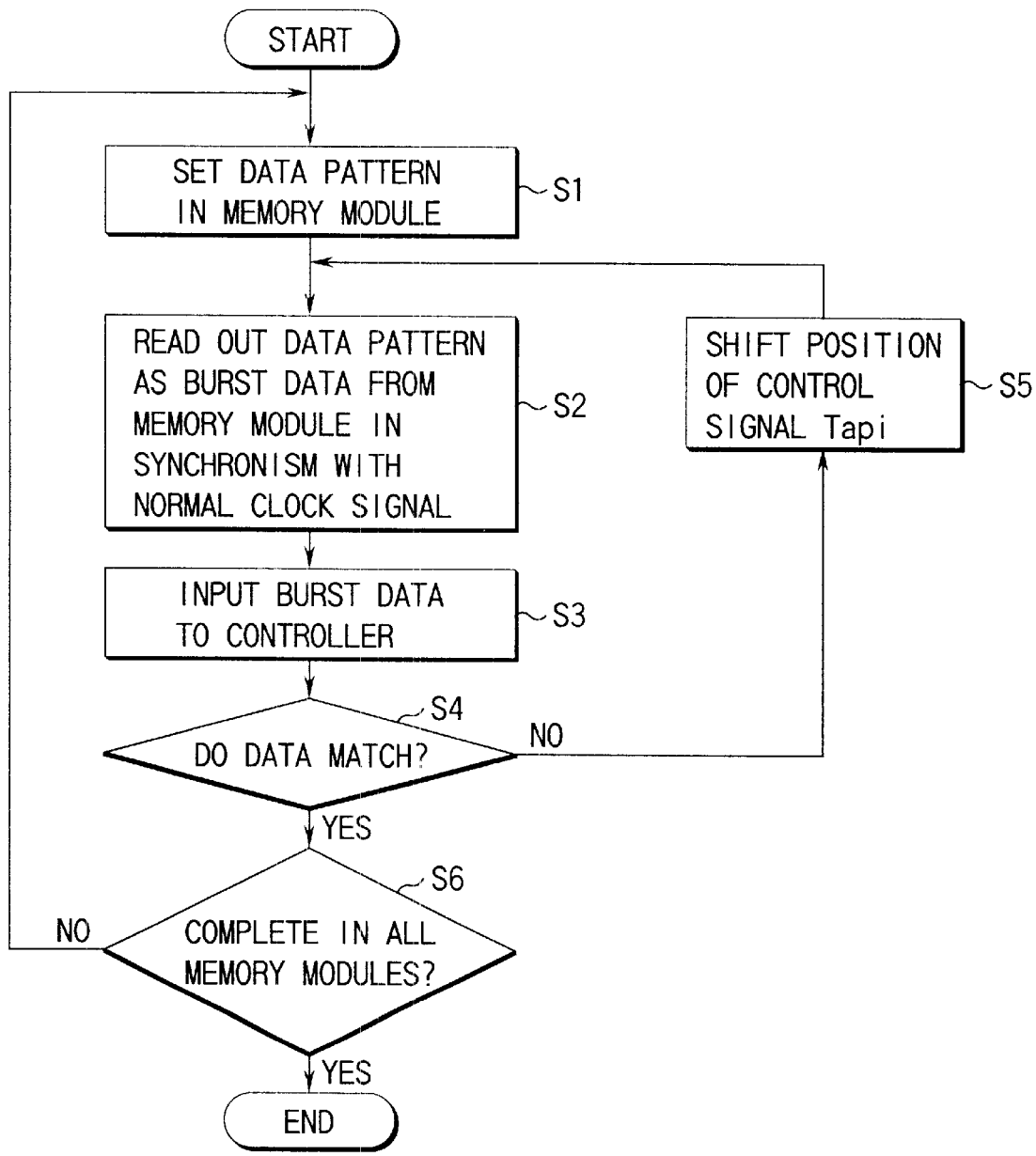
FIG. 17 is a flow chart showing an example of control of the operation in the system of the first embodiment.
Figure 18:
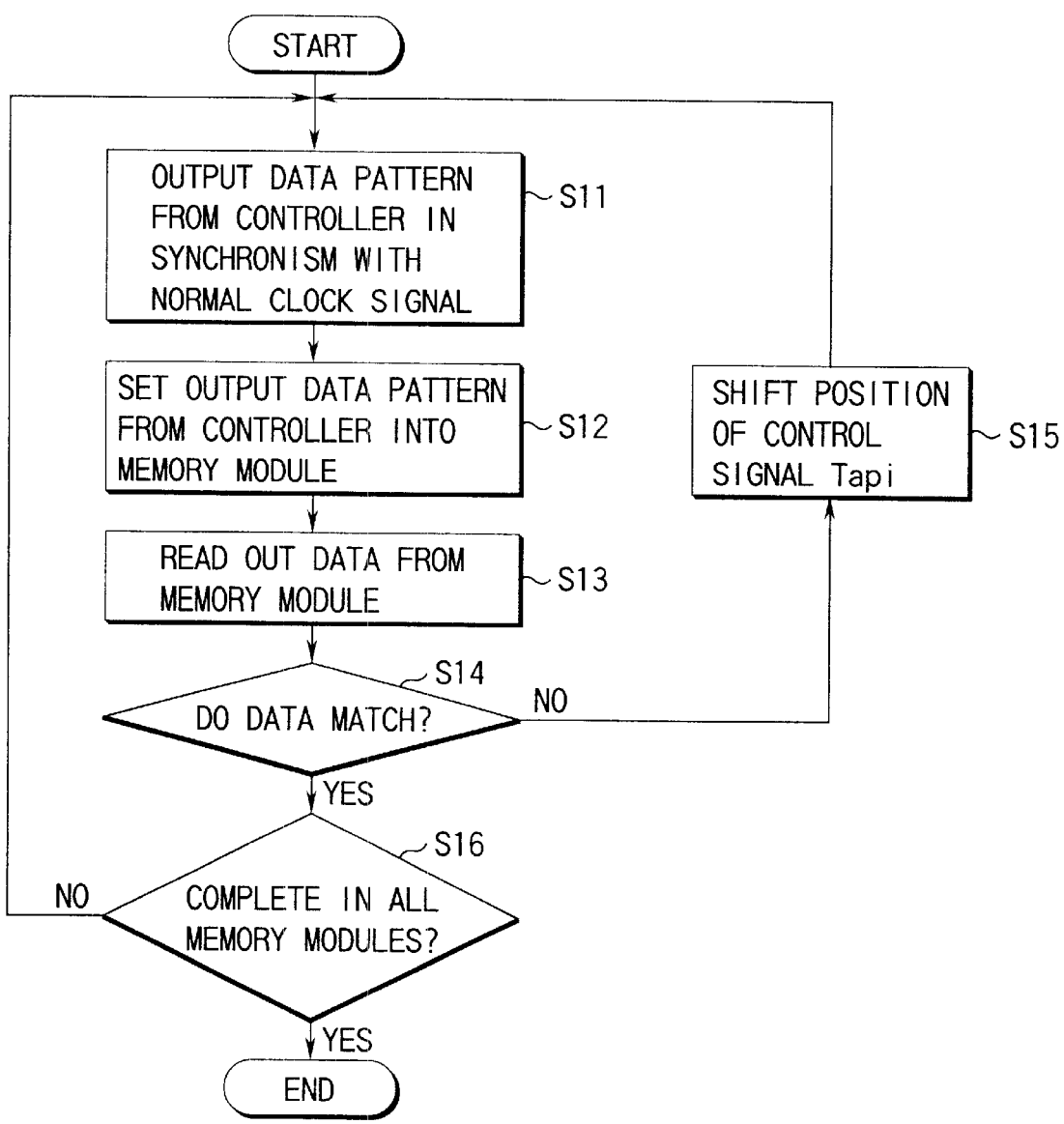
FIG. 18 is a flow chart showing an example of control of the operation in the system of the first embodiment.

Procedures of setting a signal delay amount in a system comprising a controller and memory modules will be described below with reference to flow charts in FIGS. 17 and 18.

When the controller first accesses a memory module, no variable delay amount is set. Hence, the transfer timing of data is not optimized, so neither correct data read nor write are ensured. Therefore, it is important to set the control signal Tapi. For example, when the aforementioned 4-bit data pattern "1001" is used, information indicating how to shift the control signal Tapi is obtained as already described above. First, the timing of the internal clock signal intRC', which is output from the internal clock signal generating circuit 92 shown in FIG. 15 and used to output data to a data bus line, is adjusted by a procedure as indicated by the flow chart in FIG. 17.

In step S1, a data pattern such as "1001" is set as data in one memory module. More specifically, the controller transfers data to this memory module more slowly than in normal operation, thereby inputting the data bit by bit. Since the data is, transferred more slowly than in normal operation, the data input control circuit 96 shown in FIG. 15 for loading data transferred to the data bus line can correctly load the data pattern. In this example, the controller sets data in a memory module by supplying the data to the memory module. Instead, a memory module can previously have a data pattern as fixed data.

In step S2, the data pattern is read out from the memory module by a command from the controller in synchronism with a clock signal having a normal frequency. Consequently, the data pattern is output as burst data from the memory module to the data bus line. In step S3, the controller loads this burst data. In step S4, the controller compares this loaded burst data with the original data supplied to the memory module. If the two data do not match, the flow advances to step S5. In step S5, the controller gives a command to this memory module to shift the position of the control signal Tapi to the right or left, as explained earlier, thereby adjusting the timing of the internal clock signal intRC'. The flow then returns to step S2, and the data pattern is read out from the memory module.

If the controller detects in step S4 that the two data match, this means that the timing of the internal clock signal intRC' is optimally adjusted. In step S6, the controller checks whether the timing of the internal clock signal intRC' is completely adjusted for all memory modules. If the controller determines that the adjustment is incomplete, the f low returns to step S1, and the controller similarly adjusts the timing of the internal clock signal intRC' for a new memory module. If the controller determines in step S6 that the timing of the internal clock signal intRC' is completely adjusted for all memory modules, the operation of adjusting the timing of the internal clock signal intRC' in each memory module is complete.

Consequently, the timing depending upon the position of each memory module on the data bus line is completely adjusted. Hence, the controller can correctly load data from any memory module by strobe at a predetermined timing from a clock signal. Subsequently, the data read timing in each memory module is adjusted. This adjustment of the data read timing is to adjust the timing of the output internal clock signal intTC' from the internal clock signal generating circuit 91 shown in FIG. 15. The timing is adjusted by a procedure as indicated by the flow chart shown in FIG. 18.

In step S11, the controller outputs a data pattern such as "1001" as burst data at the normal transfer timing (transfer timing in normal operation). In step S12, the output data pattern from the controller is set in one memory module. In step S13, this data pattern is read out from the memory module and transferred to the controller, and the controller loads the data pattern. In step S14, the controller compares the loaded burst data with the original data supplied to the memory module. If the two data do not match, the flow advances to step S15. In step S15, the controller gives a command to the memory module to shift the position of the control signal Tapi to the right or left, as explained earlier, thereby adjusting the timing of the internal clock signal intTC'. The flow then returns to step S2, and the data pattern is read out from the memory module.

If the controller detects in step S14 that the two data match, this means that the timing of the internal clock signal intTC' is optimally adjusted. In step S16, the controller checks whether the timing of the internal clock signal intTC' is completely adjusted for all memory modules. If the controller determines that the adjustment is incomplete, the flow returns to step S11, and the controller similarly adjusts the timing of the internal clock signal intTC' for a new memory module. If the controller determines in step S16 that the timing of the internal clock signal intTC' is completely adjusted for all memory modules, the operation of adjusting the timing of the internal clock signal intTC' in each memory module is complete.

Following the procedures as described above, the timings of the two kinds of internal clock signals are adjusted for all memory modules connected to the data bus line. After that, the controller outputs data in synchronism with the clock signal TCLK. This allows any memory module to correctly load the data.

In this manner, the setting of the signal delay amount in each memory module is complete. Hence, the controller can transfer data at. a predetermined timing regardless of the position of a memory module on the bus or the difference between environments of bus systems.

The second embodiment of the present invention will be described below with reference to FIG. 19.

Figure 19:
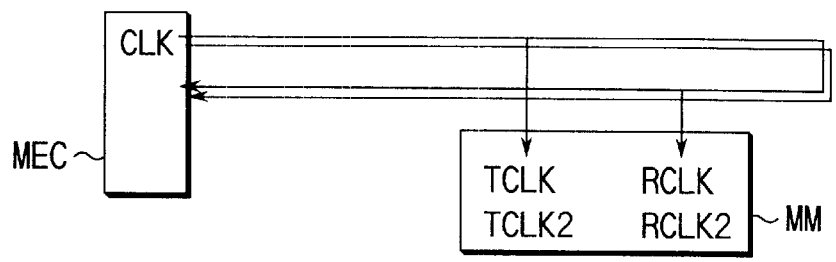
FIG. 19 is a schematic block diagram showing a memory board system according to the second embodiment of the present invention.

FIG. 19 is a schematic block diagram showing a memory board system according to the second embodiment of the present invention. A controller MEC outputs a clock signal CLK (corresponding to TCLK and RCLK). A plurality of memory modules MM (only one is shown in FIG. 19) receive this clock signal. These memory modules MM receive commands and data at the timing of this clock signal and output data to the controller MEC in synchronism with the clock signal returning by loop back. As the clock signal CLK, the controller MEC outputs the clock signals TCLK and RCLK described above and clock signals TCLK2 and RCLK2 having a period twice the period of the clock signals TCLK and RCLK at the same time.

By using these twofold-period clock signals TCLK2 and RCLK2, the controller MEC discriminates between even-numbered and odd-numbered clocks of the clock signals TCLK and RCLK and changes a difference between data transfer times corresponding to the positions of the memory modules MM on a data bus line, thereby effectively using the data bus line. The basis of a system which effectively uses a data bus line by using a certain clock signal and a clock signal having a period twice the period of the former clock signal is described in detail in Japanese Patent Application No. 10-8297 filed by the present inventor.

Figure 20:
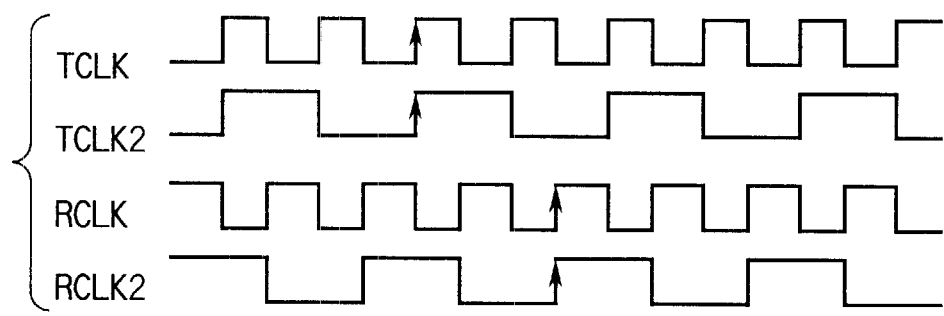
FIG. 20 is a timing chart showing the phase relationship between a plurality of clocks in the second embodiment.

FIG. 20 is a timing chart showing the phase relationship between the clock signals TCLK, RCLK, TCLK2, and RCLK2. As shown in FIG. 20, cycles indicated by upward arrows are corresponding cycles before and after the turning point of a clock signal. Since twofold-period clock signals are used, the clock signals TCLK and RCLK received by a memory module or the controller can be divided into, even-numbered clocks and odd-numbered clocks. In the following description, a suffix "e" is attached to signals relating to an even-numbered clock signal, a suffix "o" is attached to signals relating to an odd-numbered clock signal, a suffix "u" is attached to signals synchronizing with the leading edges of the clock signals TCLK and RCLK, and a suffix "d" is attached to signals synchronizing with the timing whose phase is shifted 180° from the leading edge period.

In a system with this arrangement, whether data can be transferred without causing any data collisions on the data bus and producing any transfer gap periods even when the phases of the clock signals TCLK and RCLK shift from each other within a range of 360°×2, i.e., a range of two periods of the clock signals TCLK and RCLK will be described below. To this end, it is only necessary to set an intermediate timing tM between the clock signals TCLK and RCLK out of phase from each other. By setting this intermediate timing tM, the clock signals TCLK and RCLK having corresponding periods can be related, and this allows memory modules in different positions on the data bus to transfer data without causing any data collisions on the data bus and producing any data transfer gap periods. A practical method and circuit for setting the intermediate timing tM will be described in detail later.

Figure 21:
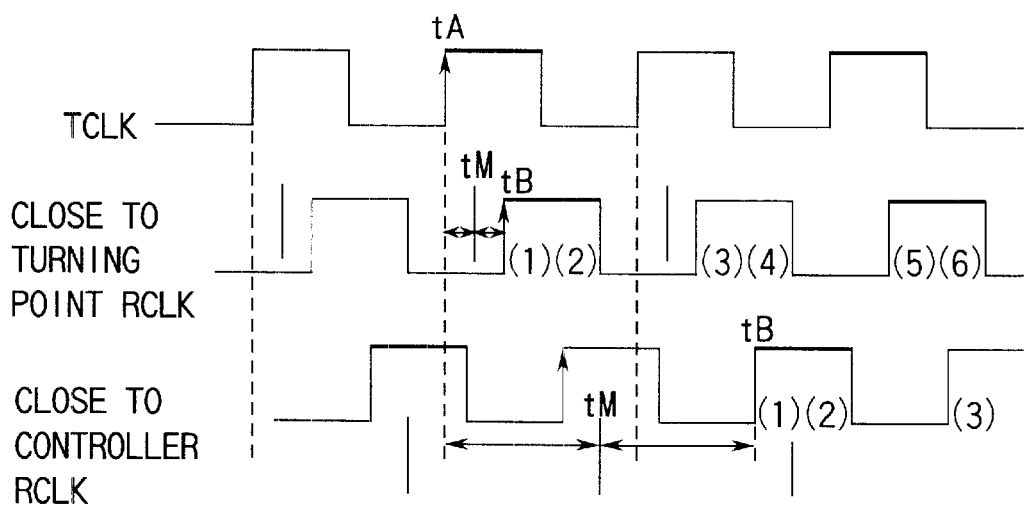
FIG. 21 is a timing chart for explaining a method of forming a timing tM at which a memory module transfers data without causing any data collisions in a data bus line without any data transfer gap in the second embodiment.

FIG. 21 shows the phase relationship between the clock signals TCLK and RCLK in two different positions on a clock bus line. The position of timing tA at the leading edge of the clock signal TCLK in a forward portion of the clock bus line corresponds to the position of timing tB at the leading edge of the clock signal RCLK in the same clock cycle in a backward portion of the clock bus line. On the basis of the clock signals TCLK in positions close to and far from the turning point of the clock bus line, the relationship between the timings tA, tM, and tB is as shown in FIG. 21.

A clock signal transferred from the controller MEC to each memory module MM is TCLK, and a clock signal transferred from each memory module MM to the controller MEC is RCLK. Therefore, no data collisions occur on the data bus line if each memory module MM receives a command at the timing tA and outputs data to the data bus line at the timing tB in synchronism with the clock signal RCLK. No free cycles are formed in data received by the controller MEC.

Each memory module MM receives a command at the timing tA and, after a predetermined cycle from the timing tB, i.e., after so-called latency, outputs data to the data bus line. To set latency after completely outputting a series of data and before starting a new data output cycle, each memory module MM must count the clock signal RCLK in accordance with the latency by using a counter. Hence, each memory module MM includes a counter for counting the number corresponding to the latency. A procedure of controlling the operation of this counter will be described below.

(1) If a command received in synchronism with the clock signal TCLK is a new cycle count command, cycle counting is enabled at the timing tM immediately after that. If a command received in synchronism with the clock signal TCLK is not a new cycle count command, including the absence of a command, cycle counting is not enabled.

(2) Cycles are counted in synchronism with the clock signal RCLK, from the clock signal RCLK immediately after the timing tM, and a necessary number of cycles are continued.

When cycles of the clock signal RCLK are counted following the above procedure by receiving a command synchronizing with the clock signal TCLK, even a memory module arranged close to the turning point and a memory module arranged close to the controller can output data to the data bus line with the same latency from the timing tA in synchronism with the clock signal RCLK, in the order of numbers attached to the clock signal RCLK in FIG. 21.

In the controller, the timing tA of the clock signal TCLK and the timing tB of the clock signal RCLK are similarly related via the intermediate timing tM. Therefore, the controller can perform an operation of outputting a command and receiving data read out from a memory module in accordance with the command in exactly the same manner regardless of the position of this memory module on the data bus line.

Cycles indicated by the thick lines and cycles indicated by the thin lines in FIG. 21 can be discriminated by the twofold-period clock signals TCLK2 and RCLK2. Accordingly, the intermediate timing tM can be decided even if the phases of the clock signals TCLK and RCLK shift one cycle to less than two cycles. That is, a signal delay time on the clock bus line is longer than the period of the clock signals (TCLK and RCLK). Therefore, when the clock signal TCLK returns as the clock signal RCLK, a transfer time equivalent to two cycles is allowable.

A practical method of setting the intermediate timing tM by the memory module MM or the controller MEC will be described below.

Figure 22:
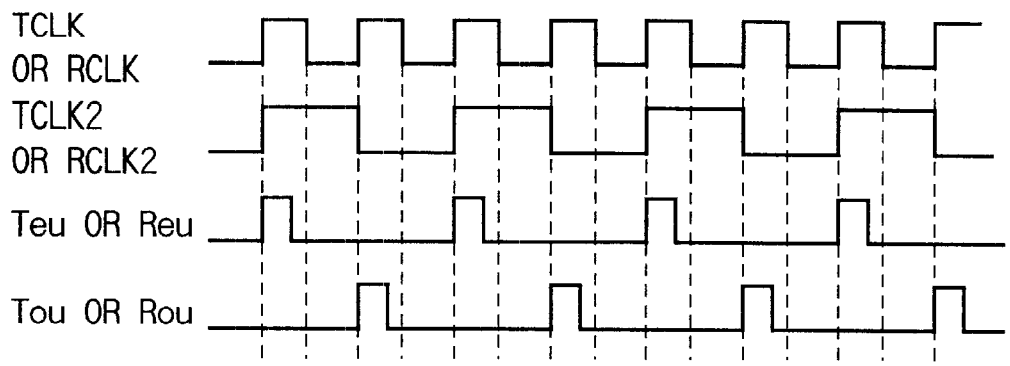
FIG. 22 is a timing chart showing the relationship between a plurality of internal clocks in the second embodiment.

FIG. 22 shows the correlation between an even-numbered internal clock signal Teu or Reu and an odd-numbered internal clock signal Tou or Rou formed in synchronism with the external clock signal TCLK or RCLK, respectively. If these internal clock signals are formed in the memory module or the controller, the memory module or the controller can form the timing tM by using these signals.

When a cycle (to be referred to as a CLK2 cycle hereinafter) of the internal clock signal Rou or the external clock signal RCLK exists which lags by δ behind a cycle (to be referred to as a CLK1 cycle hereinafter) of the internal clock signal Tou or the external clock signal TCLK, the timing tM corresponds to a timing which lags by δ/2 behind the CLK1 cycle. This timing tM is formed by the following method.

First, a phase difference $(2\tau - \delta)$ between a period $2\tau$ of two cycles of the CLK1 cycle or the CLK2 cycle and a delay ($\delta$) of the CLK2 cycle from the CLK1 cycle is formed. Next, a timing which lags behind by a half period $(\tau - \delta/2)$ of this phase difference $(2\tau - \delta)$ is formed from the CLK1 cycle. A delay $(\tau + \delta/2)$ to a certain CLK1 cycle is generated from this timing formed, and a timing which lags behind by this delay from this CLK1 is formed. This timing is the timing which lags by $\delta/2$ behind the CLK1 cycle.

A practical method of forming the timing tM by using the aforementioned synchronous adjustable delay (SAD) will be described below with reference to a timing chart shown in FIG. 23. Assume that the external clock signal TCLK is transferred in a forward portion of the clock bus line and transferred as the clock signal RCLK in a backward portion of the clock bus line via the turning point, and this produces a phase difference δ between the clock signals TCLK and RCLK. This phase difference δ is 0° to (360×2)°, i.e., within two cycles of the clock signal TCLK.

Figure 23:
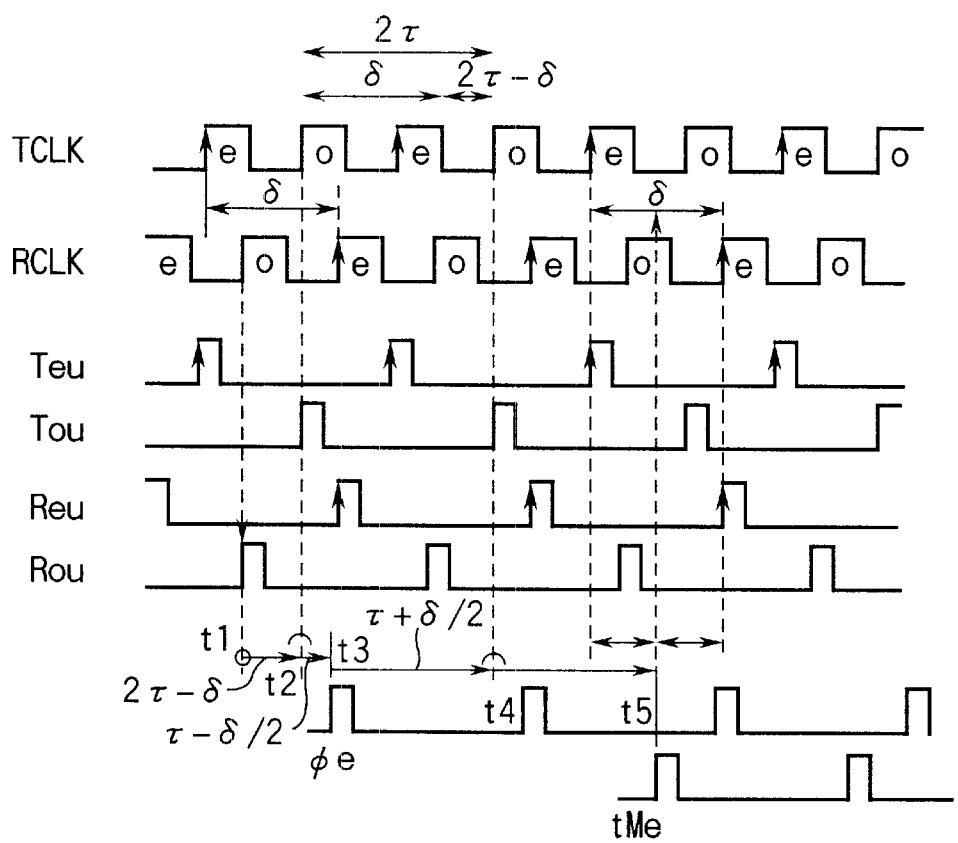
FIG. 23 is a timing chart for explaining a practical method of forming the timing tM by using a synchronous adjustable delay in the second embodiment.

Referring to FIG. 23, clock signals are classified into even-cycle clock signals e and odd-cycle clock signals o. FIG. 23 shows the way the intermediate timing tM is obtained from the timing of the leading edge of the even cycle e with an upward arrow. Note that the odd clock cycle can be regarded as the same as the even-clock cycle, so a detailed description thereof will be omitted.

First, the internal clock signal Rou rises to HIGH level at time t1. By using the synchronous adjustable delay, a delay amount from the leading edge of the internal clock signal Rou to the leading edge of the internal clock signal Tou which is generated immediately after that is measured at time t2 at which this internal clock signal Tou rises. Next, after a delay amount half that of the measured delay amount, an internal clock signal φe is generated at time t3. Letting τ be the period of the external clock signals TCLK and RCLK, a delay amount between the internal clock signals Rou and Tou is 2τ−δ. Accordingly, a period between the times t2 and t3, i.e., a delay amount between the internal clock signals Tou and φe is τ−δ/2. In addition, by using the synchronous adjustable delay, a delay amount from the leading edge of the internal clock signal φe to the leading edge of the internal clock signal Tou immediately after that is measured at time t4 at which the internal clock signal Tou rises. After the same delay amount as this measured delay amount, tMe is generated at time t5.

A delay time from time t2 to time t4 is 2τ, equal to the period of the internal clock signal Tou. So, a delay time from time t3 to time t4, i.e., a delay amount between the internal clock signals φe and Tou is τ+δ/2 which is the difference between the delay amount from time t2 to time t4 and the delay amount from time t2 to time t3. A delay amount from time t4 to time t5 is equally τ+δ/2. Therefore, the leading edge of tMe after the delay of τ+δ/2 from the internal clock signal Tou lags by δ/2 behind the leading edge of the internal clock signal Teu, and this leading edge is the intermediate timing between the internal clock signals Teu and Reu.

As described above, a necessary timing signal can be obtained in five cycles of the clock signals TCLK and RCLK. When the suffixes e and o are interchanged in FIG. 23 and the above explanation, a timing tMo which lags by δ/2 behind the leading edge of the internal clock signal Tou is obtained. The timing tM shown in FIG. 21 is obtained by synthesizing the timings tMe and tMo.

Practical arrangements and operations of internal clock generating circuits for generating the internal clock signals Tou, Rou, Teu, and Reu explained in FIGS. 22 and 23 will be described below with reference to FIGS. 24A, 24B, 24C, and 25.

Figure 24A:
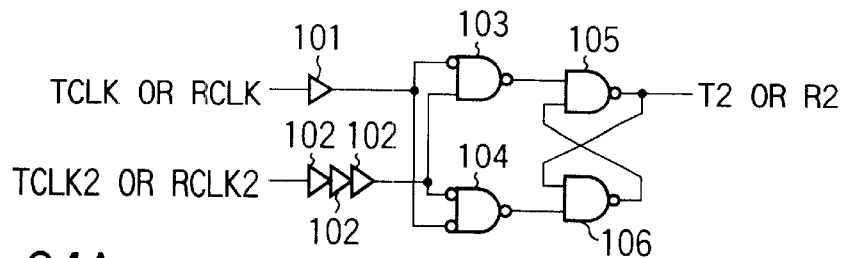
FIGS. 24A, 24B, and 24C are circuit diagrams showing practical arrangements of internal clock signal generating circuits for generating various clock signals shown in FIGS. 22 and 23.

FIG. 24A shows a circuit for forming a signal T2 or R2 for dividing the even- and odd-cycle clock signals e and o of the external clock signal TCLK or RCLK. This circuit includes a buffer circuit 101 for receiving the external clock signal TCLK or RCLK, an odd number of (in this embodiment, three) cascaded buffer circuits 102 for receiving the external clock signal TCLK2 or RCLK2, and four NAND gate circuits 103 to 106.

An output from the buffer circuit 101 is inverted and input to one input terminal of the NAND gate circuit 103 and also inverted and input to one input terminal of the NAND gate circuit 104. An output from the third buffer circuit 102 of the three cascaded buffer circuits 102 is input to the other input terminal of the NAND gate. circuit 103 and the other inverting input terminal of the NAND gate circuit 104. An output from the NAND gate circuit 103 is supplied to one input terminal of the NAND gate circuit 105. An output from the NAND gate circuit 104 is supplied to one input terminal of the NAND gate circuit 106. The other input terminals of the NAND gate circuits 105 and 106 are connected to the output terminals of the NAND gates 106 and 105, respectively.

Figure 25:
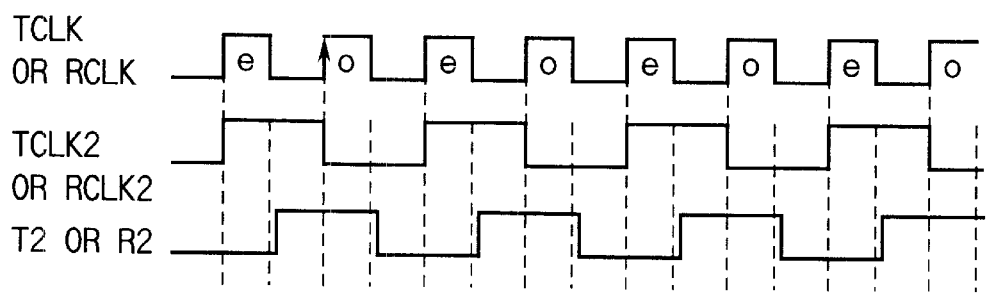
FIG. 25 is a timing chart for explaining the operations of the internal clock signal generating circuits shown in FIGS. 24A, 24B, and 24C.

That is, in the circuit shown in FIG. 24A, the two NAND gate circuits 105 and 106 construct a flip-flop circuit, and this flip-flop circuit forms the signal T2 or R2 for dividing the even- and odd-cycle clock signals e and o. The signal T2 (R2) changes to HIGH level when the external clock signal TCLK (RCLK) transits to LOW level while the input external clock signal TCLK2 (RCLK2) is at HIGH level. The signal T2 (R2) changes to LOW level when the external clock signal TCLK (RCLK) transits to LOW level while the input external clock signal TCLK2 (RCLK2) is at LOW level. A timing chart in FIG. 25 shows the relationship between the external clock signals TCLK (RCLK) and TCLK2 (RCLK2) and the signal T2 (R2).

Figure 24B:
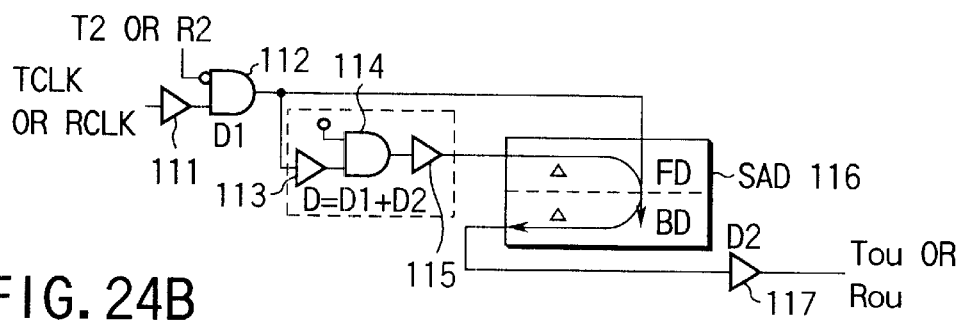
Figure 24C:
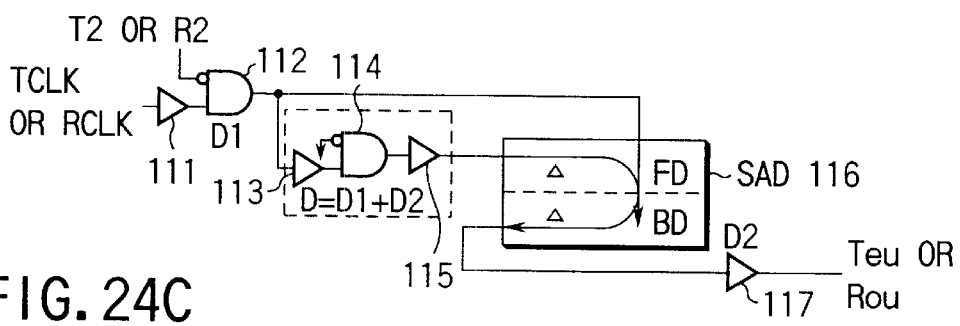

FIG. 24B shows the configuration of a circuit for forming the internal clock signal Tou or Rou. FIG. 24C shows the configuration of a circuit for forming the internal clock signal Teu or Reu. The basic configurations of these circuits are identical, and only input signals are different. So FIG. 24B will be representatively described below.

The circuit shown in FIG. 24B is constructed as follows. The external clock signal TCLK or RCLK is supplied to one input terminal of an AND gate circuit 112 via a buffer circuit 111. The signal T2 or R2 formed by the circuit shown in FIG. 24A is supplied to the other input terminal of this AND gate circuit 112. An output from the AND gate circuit 112 is supplied to one input terminal of an AND gate circuit 114 via a buffer circuit 113. A HIGH-level signal is constantly supplied to the other input terminal of this AND gate circuit 114. An output from the AND gate circuit 114 is supplied to a forward delay FD of a synchronous adjustable delay 116 via a buffer circuit 115. The output from the AND gate circuit 112 is also supplied as a control clock signal to the synchronous adjustable delay 116. This synchronous adjustable delay 116 includes a backward delay BD in addition to the forward delay FD.

The forward delay FD of the synchronous adjustable delay 116 includes a plurality of delay units. An input signal to this forward delay FD is delayed while being transmitted through these delay units. The synchronous adjustable delay 116 detects a delay time Δ, from the timing at which the buffer circuit 115 supplies a signal to the forward delay FD to the timing of the leading edge of an output signal from the AND gate circuit 112 in the next cycle, in accordance with the number of delay units through which the input signal to the forward delay FD is transmitted. The forward delay FD holds a delay amount corresponding to this detected signal delay time Δ.

The backward delay BD delays a signal by a delay amount corresponding to the delay time Δ held by the forward delay FD. A signal from the backward delay BD is output as the internal clock signal Tou or Rou via a buffer circuit 117.

Letting D1 be a delay time in the circuit constructed of the buffer circuit 111 and the AND gate circuit 112 with respect to the external clock signal TCLK or RCLK and D2 be a delay time in the buffer circuit 117 with respect to the output signal from the backward delay BD, a delay time D in the delay circuit constructed of the buffer circuit 113, the AND gate circuit 114, and the buffer circuit 115 is so set as to be D1+D2 with respect to the output signal from the AND gate circuit 112.

Although the basic operation of the circuit using this synchronous adjustable delay is previously explained, this operation will be briefly described below. When D=D1+D2 as shown in FIGS. 24B and 24C, the leading edge of the internal clock signal Tou or Rou matches the leading edge of an odd clock of the external clock signal TCLK or RCLK. This is so because a delay amount D+Δ is equal to a period 2τ of an odd cycle of the external clock signal TCLK or RCLK. The period of Δ is compensated for by detecting changes in the period τ or the delay times D1 and D2.

The only difference of the circuit shown in FIG. 24C from the circuit shown in FIG. 24B is that a LOW-level signal is constantly supplied to the other input terminal of the AND gate circuit 114 so that the circuit operates in an even cycle of the external clock signal TCLK or RCLK.

Figure 26A:
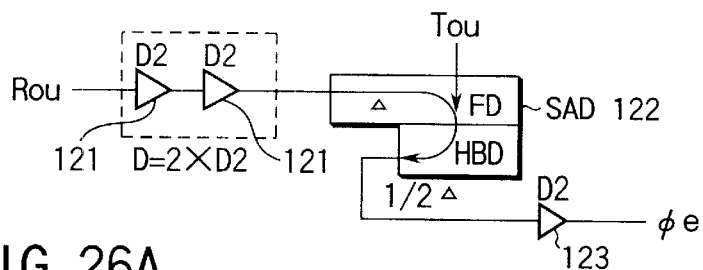
FIGS. 26A and 26B are circuit diagrams showing practical circuit configurations of circuits for generating the internal timing clock signals shown in FIG. 23.
Figure 26B:
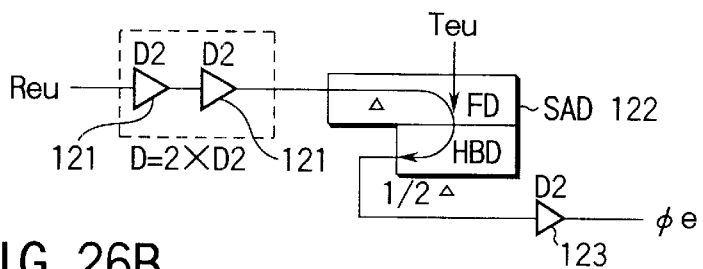

Each of FIGS. 26A and 26B shows a practical arrangement of a circuit for generating the internal timing clock signal φe (φo) shown in FIG. 23. FIG. 26A shows a circuit for generating φe, and FIG. 26B shows a circuit for generating φo. Since the two circuits have the same basic arrangement, FIG. 26A will be representatively described below.

The internal clock signal Rou is delayed by D (=2×D2) by a delay circuit constructed of two cascaded buffer circuits 121 and supplied to a forward delay FD of a synchronous adjustable delay 122. The internal clock signal Tou is supplied to this synchronous adjustable delay 122. The forward delay FD of the synchronous adjustable delay 122 detects a delay amount Δ from the signal supplied to the forward delay FD to the internal clock signal Tou. In a half backward delay HBD, the number of delay units is halved from that in the forward delay (or backward delay) such that a delay amount is always half that of the forward delay FD. A signal output from the synchronous adjustable delay 122 with a delay Δ/2 from the input timing of the internal clock signal Tou is delayed by a delay time D2 by a buffer circuit 123 and output as the internal timing clock signal φe.

That is, a delay amount from the internal clock signal Rou to the internal clock signal Tou is 2×D2+Δ. A delay amount from the internal clock signal Tou to the internal timing clock signal φe is half the former delay amount, D2+Δ/2.

In the circuit shown in FIG. 26B, the internal timing clock signal φo is obtained from the internal clock signals Reu and Teu in the same manner as above.

Figure 27:
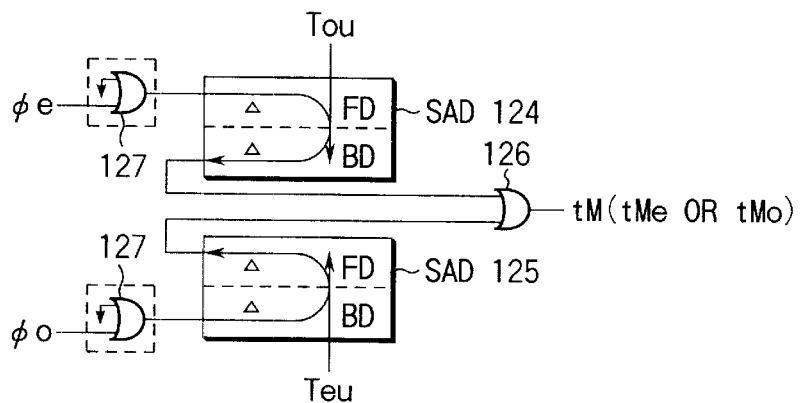
FIG. 27 is a circuit diagram of a circuit for generating the timing tM in the second embodiment.

As shown in FIG. 23, the timing signal tMe is obtained by detecting the delay amount from the internal timing clock signal φe to the internal clock signal Tou on the basis of the timing of the leading edge of the internal clock signal Tou. Also, the timing tMo is obtained by detecting the delay amount from the internal timing clock signal φo to the internal clock signal Teu on the basis of the timing of the leading edge of the internal clock signal Teu. Additionally, the timing tM can be obtained by synthesizing these timings tMe and tMo. FIG. 27 shows the configuration of a circuit for generating this timing tM.

The function of the circuit shown in FIG. 27 is basically the same as the circuit shown in FIG. 24A or 24B. In this circuit, an OR gate circuit 126 ORs output signals from two synchronous adjustable delays 124 and 125 each having a forward delay FD and a backward delay BD, thereby obtaining the timing tM (tMe or tMo). To match delay amounts in the input and output stages, therefore, OR gate circuits 127 and 128 are connected to the inputs of the synchronous adjustable delays 124 and 25, respectively. The OR gate circuit 127 receives the internal timing clock signal φe and a LOW-level signal. The OR gate circuit 128 receives the internal timing clock signal φo and a LOW-level signal. Also, the synchronous adjustable delays 124 and 125 receive the internal clock signals Tou and Teu, respectively.

Data is input and output by so-called DDR (Double Data Rate) by which data is transferred twice in one cycle of the external clock. signal TCLK or RCLK. Also, the reference timing is defined only by the leading edge of the external clock signal TCLK or RCLK and independent of the duty ratio of the clock signal. This is so because it is considered to be difficult to ensure accurate duty of the clock signal independently of the position on the clock bus line. Therefore, a timing is generated in exactly the. middle of one leading edge and the next leading edge of the clock signal and used for DDR transfer of data together with the leading edge of the clock signal.

Figure 28:
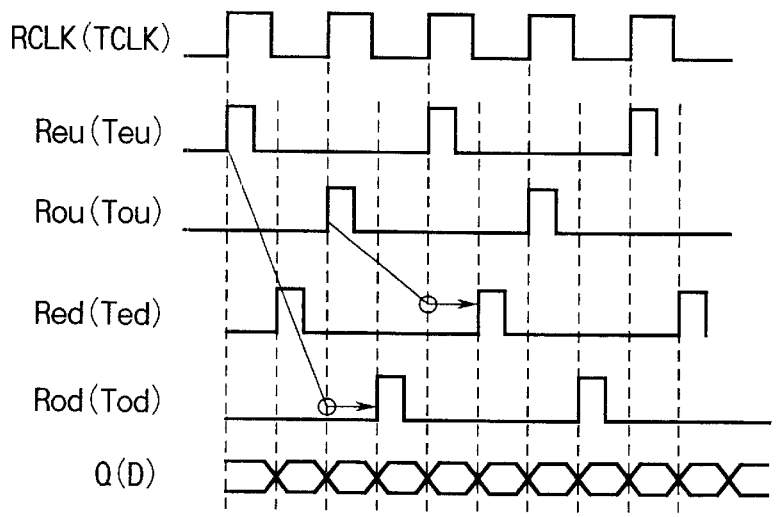
FIG. 28 is a timing chart for explaining a method of generating an internal timing signal when data is output by using an external clock signal TCLK.

As shown in a timing chart of FIG. 28, the internal clock signals Reu (Teu), Rou (Tou), Red (Ted), and Rod (Tod) are generated, and data is transferred in synchronism with these signals.

Methods of generating an internal clock signal synchronizing with the leading edge of a clock signal are already described with reference to FIGS. 24A to 25. Therefore, methods of generating a clock signal whose phase is shifted 180° from that of an internal clock signal synchronizing with the leading edge of a clock signal will be described below with reference to FIGS. 29A and 29B.

Figure 29A:
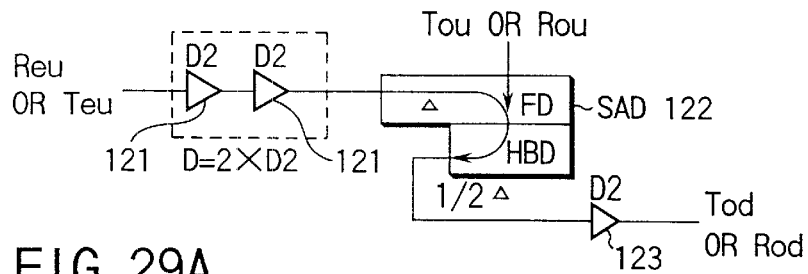
FIGS. 29A and 29B are circuit diagrams showing the configurations of circuits for generating a clock signal whose phase is shifted 180° from an internal clock signal synchronizing with the leading edge of a clock signal.
Figure 29B:
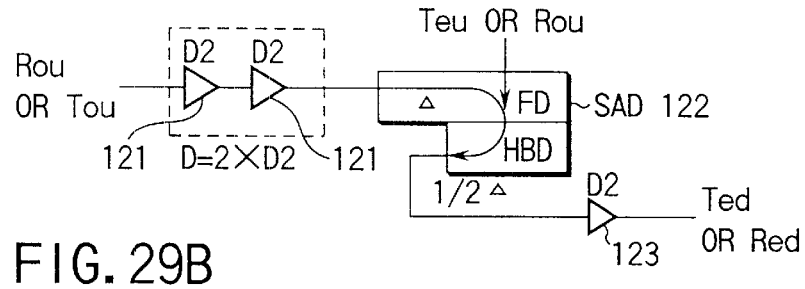

The configurations of circuits shown in FIGS. 29A and 29B are the same as those shown in FIGS. 26A and 26B except for input and output signals. So, the same reference numerals as in FIGS. 26A and 26B denote the same parts in FIGS. 29A and 29B, and a detailed description thereof will be omitted.

FIG. 29A shows a circuit for forming an even-numbered internal clock signal whose phase is shifted 180° from the leading edge. FIG. 29B shows a circuit for forming an odd-numbered internal clock signal whose phase is shifted 180° from the leading edge.

A method of generating the internal clock signal Tod in the circuit shown in FIG. 29A will be briefly described below. A phase difference between the internal clock signals Teu and Tod corresponds to the cycle of the external clock signal TCLK (RCLK) and is 360°. A forward delay FD of a synchronous adjustable delay 122 detects Δ corresponding to this delay amount. A half backward delay HBD forms a delay amount Δ/2. The phase of the internal clock signal Tod generated through the half backward delay HBD from the internal clock signal Tou lags 180° behind the internal clock signal Tou. Input data is transferred with a certain data window with respect to the timing of the leading edge of the external clock signal TCLK (RCLK) and the timing whose phase is shifted 180° from the former timing. Therefore, data can be input in synchronism with the leading edge of the signal Tod (Rod) generated by the circuit shown in FIG. 29A.

The aforementioned timing chart shown in FIG. 28 shows a method of generating an internal timing signal when data output is controlled by using the external clock signal RCLK. The internal clock signals Reu, Rou, Red, and Rod already described are used. Q(D) indicates the state of data output; data switching is performed in synchronism with the timings of the leading edges of these internal clock signals Reu, Rou, Red, and Rod.

The above second embodiment does not particularly describe a variable delay function by which the timing of the leading edge of an internal clock signal generated by using a synchronous adjustable delay is adjusted in accordance with a difference based on a signal delay on an actual data bus line. In this embodiment, this variable delay function is imparted to the circuits for generating the internal clock signals Teu, Tou, Reu, and Rou in order not to increase the circuit scale.

Figure 30A:
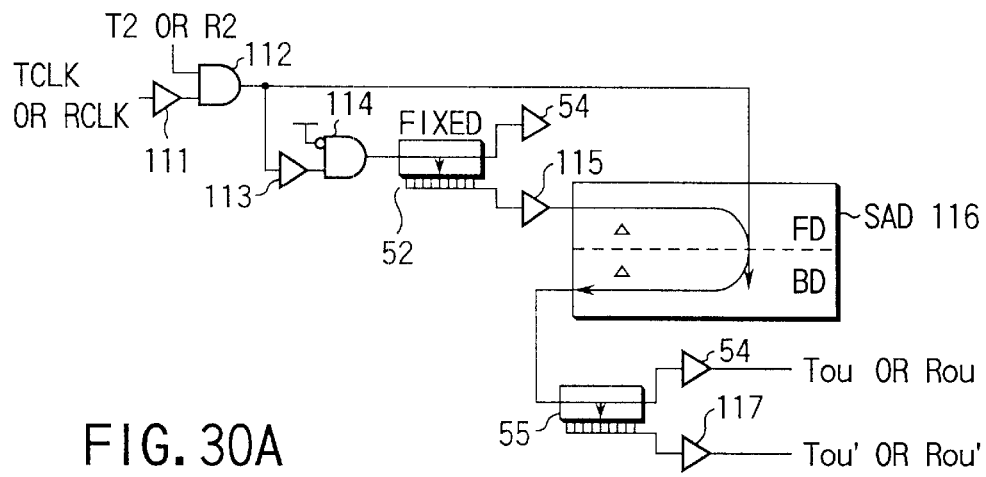
FIGS. 30A and 30B are circuit diagrams showing internal clock signal generating circuits by which a variable delay function is given to internal clock signals Tou, Teu, Rou, and Reu.
Figure 30B:
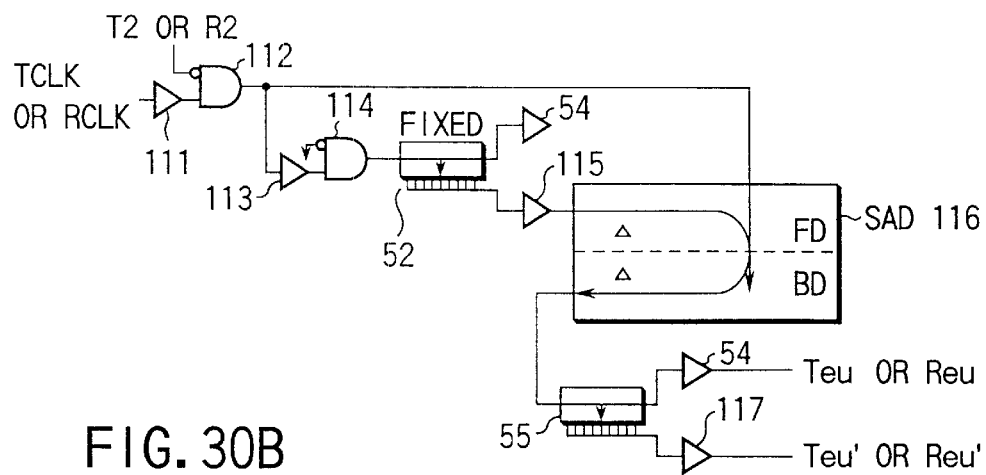

FIGS. 30A and 30B show the configurations of circuits used in place of the circuits shown in FIGS. 24A and 24B to impart the variable delay function to the circuits for generating the internal clock signals Tou, Teu, Rou, and Reu. That is, in this embodiment the circuits shown in FIGS. 30A and 30B are used instead of the circuits shown in FIGS. 24A and 24B, respectively.

The circuits shown in FIGS. 30A and 30B differ from the circuits shown in FIGS. 24A and 24B in that circuits identical with the variable delay circuits 52 and 55 formed in the circuit shown in FIG. 10 are added to adjust the timings of internal clock signals. In FIGS. 30A and 30B, internal clock signals Tou', Teu', Rou', and Reu' have undergone delay time adjustment, and the internal clock signals Tou, Teu, Rou, and Reu are in phase with the external clock signals TCLK and RCLK.

Note that the same buffer circuit 54 as in the circuit configurations described earlier is formed to match the load condition in the variable delay circuit 52 with that in the variable delay circuit 55.

It is known that a clock signal supplied to the synchronous adjustable delay as shown in FIGS. 6A and 6B or 7 contains jitters which fluctuate in a certain distribution. The reason for this is that a signal output from a clock generator and supposed to have a predetermined period contains jitters, so the average period is naturally constant.

Figure 31:
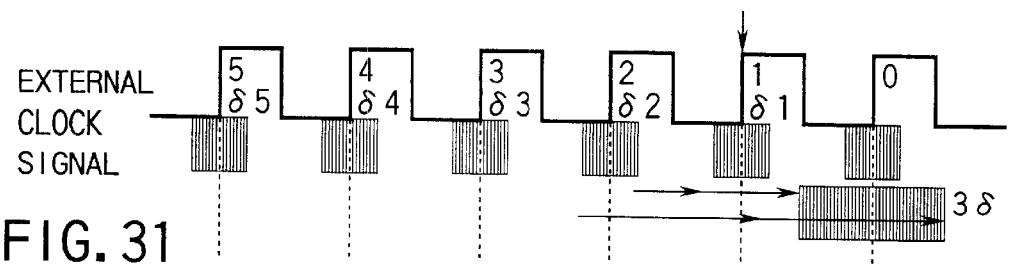
FIG. 31 is a timing chart showing the relationship between an external clock signal and jitters in this external clock signal.

As shown in FIG. 31, numbers "0" to "5" are attached to external clock signals, and δ and the same numbers as attached to the external clocks are attached to jitters contained in the external clock signals in individual cycles. A maximum statistical value of jitters is δ.

A jitter is defined as an amount which represents a delay of a clock signal having a predetermined period from time at which the signal is supposed to exist. Therefore, if an actual clock signal goes ahead, a jitter can take a negative value.

Referring to FIG. 31, assume that an internal signal is generated from a clock signal with number "1". A synchronous adjustable delay detects a delay time between a clock signal with number "2" and the clock signal with number "1", thereby measuring a delay time from the clock signal with number "1". Two extremes of the delay time between the two clock signals are when a jitter contained in the clock signal with number "2" is +δ and a jitter contained in the clock signal with number "1" is −δ, and when the jitter contained in the clock signal with number "2" is −δ and the jitter contained in the clock signal with number "1" is +δ.

Accordingly, the absolute value of a jitter contained in an internal signal generated on the basis of a clock signal with number "0" shown in FIG. 31 is 3δ.

As described above, in a system using a synchronous adjustable delay, a jitter in an external clock signal is greatly amplified depending on the status of the jitter, and this amplified jitter appears as a jitter in an internal signal synchronizing with the external clock signal.

In the synchronous adjustable delays shown in FIGS. 6A, 6B, and 7, therefore, the influence of jitters contained in external clock signals must be minimized. The third embodiment of the present invention for realizing this will be described below.

The principle of suppressing amplification of jitters contained in external clock signals by a circuit using a synchronous adjustable delay will be described first. After that, a practical circuit configuration for realizing this will be described.

Figure 32:
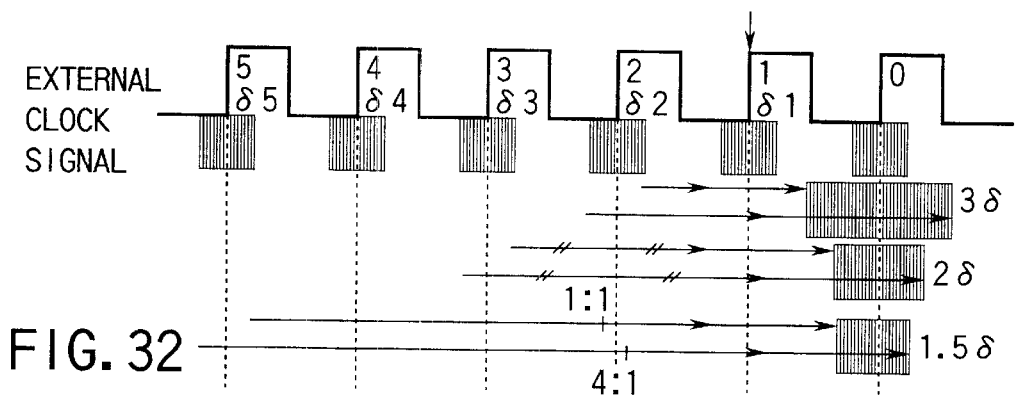
FIG. 32 is a timing chart for explaining the principle of the third embodiment of the present invention.

As shown in FIG. 32, similar to FIG. 31, numbers "0" to "5" are attached to external clock signals, and δ and the same numbers as attached to the external clocks are attached to jitters contained in the external clock signals on individual cycles. Unlike in FIG. 31, a delay amount used to generate an internal signal, generated at the timing of a clock signal with number "1" and corresponding to a clock signal with number "0", is not detected between a clock signal with number "2" and the clock signal with number "1". That is, this delay amount is detected over a plurality of cycles such as between a clock signal with number "3" and the clock signal with number "1" or between a clock signal with number "5" and the clock signal with number "1". The average value per cycle is used as the delay amount. For example, the averaged jitter is ±δ when the delay amount between the clock signal with number "3" and the clock signal with number "1" is used. A jitter contained in the clock signal with number "1" is added to this averaged jitter. Consequently, a jitter in the internal signal is ±2δ, smaller than that shown in FIG. 31.

Furthermore, jitters are averaged to 1/4 when the delay amount between the clock signal with number "5" and the clock signal with number "1" is used. Accordingly, the averaged jitter is ±0.5δ, and the jitter in the internal signal is ±1.5δ. As described above, when delay amounts used in a synchronous adjustable delay are averaged over several cycles, jitters are averaged and reduced.

A method of performing this averaging in, e.g., the synchronous adjustable delay shown in FIG. 7 will be described next.

Figure 33:
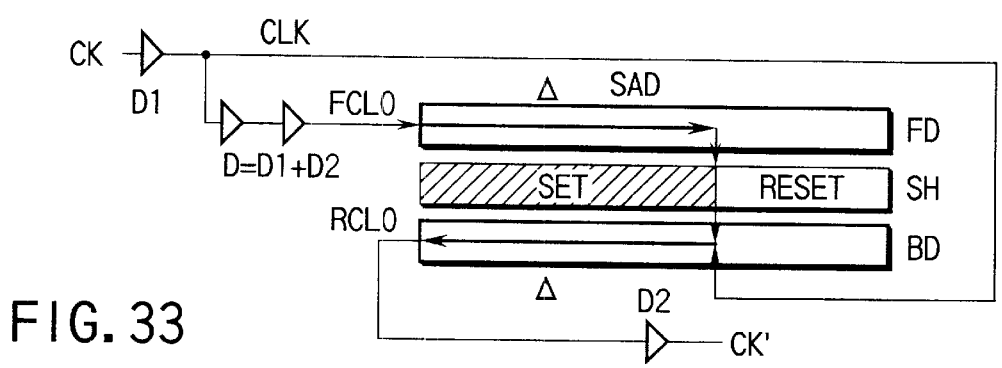
FIG. 33 is a block diagram which is a rewrite of the synchronous adjustable delay shown in FIG. 7.

FIG. 33 is a rewrite of the synchronous adjustable delay shown in FIG. 7. For the sake of simplicity of explanation, the variable delay circuits 52 and 55 for adjusting the timings of internal clock signals and the like components are not shown in FIG. 33. An input clock signal is CK. This input clock signal CK corresponds to the external clock signal TCLK or RCLK.

This synchronous adjustable delay has a sample hold circuit SH in addition to a forward delay FD and a backward delay BD. Each of the forward delay FD and the backward delay BD is constructed of a plurality of delay units. The sample hold circuit SH includes a plurality of state holding circuits corresponding to the delay units in the forward delay FD and the backward delay BD. When a forward pulse signal FCLi is transmitted in the forward delay FD, state holding circuits corresponding to delay units which transmit the signal are set from a reset state. Delay units in the backward delay BD which correspond to the set state holding circuits respectively transmit an internal clock signal CLK directly to preceding stages. In this way a delay amount A corresponding to the number of delay units which transmit the forward pulse signal can be set as the number of delay units which transmit a backward pulse signal.

Also, during transmission of the backward pulse signal, it resets state holding circuits in the sample hold circuit SH which correspond to delay units which transmit the signal. In this manner, the sample hold circuit SH can detect the delay amount Δ per cycle of a clock signal for each cycle of the signal.

In the synchronous adjustable delay shown in FIG. 7, the sample hold circuit SH is set for each cycle of a clock signal. In contrast, if the sample hold circuit SH is partially set over a plurality of cycles, the delay amount Δ per cycle can be averaged over a plurality of cycles.

Figure 34:
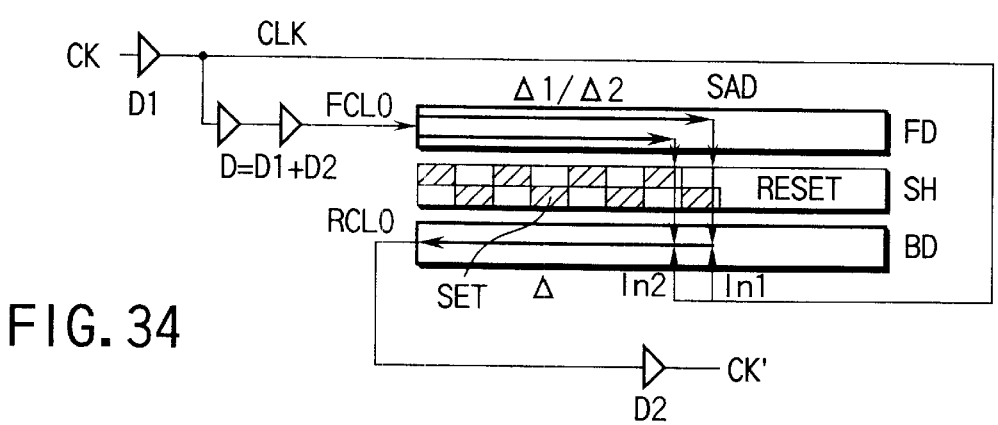
FIG. 34 is a block diagram showing the arrangement of a synchronous adjustable delay when jitters contained in an external clock signal are averaged over two cycles in the third embodiment.

FIG. 34 shows the arrangement of a synchronous adjustable delay for averaging over two cycles. In this example, the sample hold circuit SH is divided into two sections which are alternately set and reset every two continuous cycles of a clock signal.

Figure 35A:
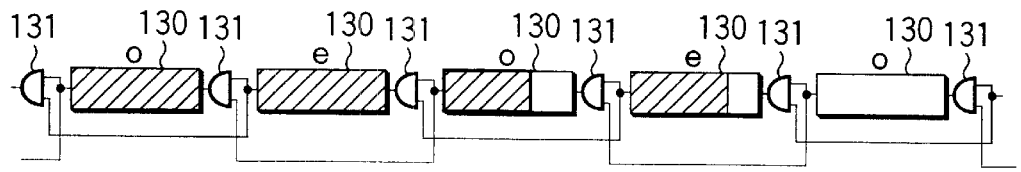
FIGS. 35A and 35B are block diagrams showing the arrangement of a backward delay when jitters contained in an external clock signal are averaged over two cycles in the third embodiment.
Figure 35B:
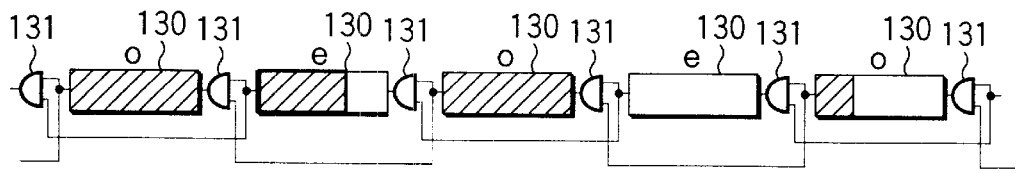

For example, the delay amount between the clock signal with number "3" and the clock signal with number "2" in FIG. 32 is measured as Δ1. Analogously, the delay amount between the clock signal with number "2" and the clock signal with number "1" in FIG. 32 is measured as Δ2. A plurality of state holding circuits constructing the sample hold circuit SH are divided into two groups. The number of state holding circuits corresponding to the half of each of these delay amounts Δ1 and Δ2 are set in each cycle. When an internal signal is formed on the basis of the clock signal with number "1", the number of set state holding circuits corresponds to the average value of the delay amounts Δ1 and Δ2. When the state holding circuits in the sample hold circuit SH are divided into four groups and alternately set every four cycles, the delay amount averaged over four cycles shown in FIG. 32 is obtained.

method of setting the number of delay units, which transmit and delay a signal in the backward delay BD, on the basis of the number of set state holding circuits will be described below. As explained in FIG. 33, the internal clock signal CLK enters the backward delay BD from the boundary between set and reset state holding circuits among other state holding circuits in the sample holding circuit SH, and this signal is transmitted in the backward delay BD. As shown in FIG. 34, therefore, if both the delay amounts Δ1 and Δ2 set state holding circuits to the middle of small blocks constructing the two divided groups of the sample hold circuit SH, the internal clock signals CLK enter the backward delay BD from two positions at the same time as indicated by In1 and In2. Accordingly, some set delay units in a portion into which the signal enters from In1 do not contribute to the delay in the backward delay BD. FIGS. 35A and 35B show a method of minimizing the number of these delay units to be ignored.

FIGS. 35A and 35B schematically show only the backward delay BD in the synchronous adjustable delay shown in FIG. 34.

Referring to FIGS. 35A and 35B, reference numerals 130 denote corresponding delay unit blocks in the two divided groups of the sample hold circuit SH. "e" and "o" are attached to these delay unit blocks 130 to indicate that these blocks are set as delay lines on alternate cycles of a clock signal.

In each delay unit block 130, a hatched portion represents set delay units. A backward pulse transmitted in small blocks of the backward delay BD is not directly transmitted to each succeeding small block; the backward pulse is ANDed with an output signal from an immediately preceding block 130 by using an AND gate circuit 131, and the logical product is transmitted. If, therefore, two small blocks 130 set to the middle are adjacent to each other as shown in FIG. 35A, a block having a larger set region functions as a delay, and a block having a smaller set region is ignored. That is, a delay by a small block 130 enclosed with the thick frame in FIG. 35A is ignored, and this produces an error. Also, as shown in FIG. 35B, if clock fluctuation is large and a difference of one or more small blocks is produced between a small block 130 with "e" and a small block 130 with "o", a delay by a small block 130 before other partially set small blocks in the pulse propagating direction, i.e., a small block 130 enclosed with the thick frame in FIG. 35B is ignored.

If the AND gate circuit 131 does not AND signals, delays by all small blocks 130 between partially set small blocks 130 are ignored. From the foregoing, only one small block is ignored regardless of the set conditions of small blocks.

Figure 36A:
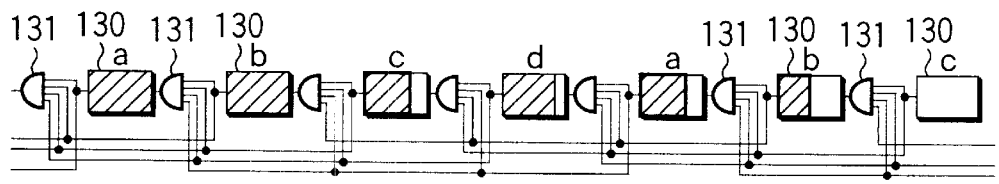
FIGS. 36A and 36B are block diagrams showing the arrangement of a backward delay when jitters contained in an external clock signal are averaged over four cycles in the third embodiment.
Figure 36B:
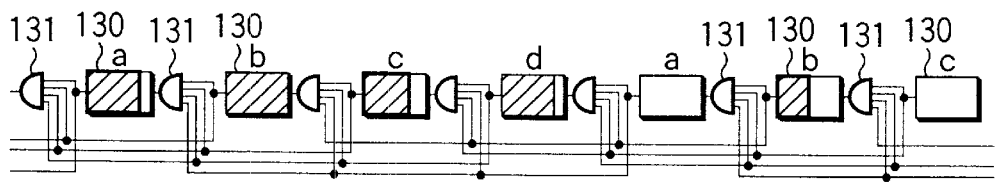

FIGS. 36A and 36B show an example in which the sample hold circuit SH is divided into four sections and an average value over four cycles is obtained. In this arrangement, small blocks 130 are classified into four types which are discriminated from each other by attaching "a", "b", "c", and "d". Also, each small block 130 receives an output signal from an AND gate circuit 131 for ANDing output signals from four consecutive small blocks. FIG. 36A shows a state in which two adjacent small blocks are partially set. If this is the case, delays by partially set small blocks are ignored except for a small block having the largest set portion. Referring to FIG. 36A, delays by small blocks enclosed with the thick frames are ignored.

FIG. 36B shows a case in which partially set small blocks are not adjacent to each other. If this is the case, a partially set small block before a fully set small block in the pulse propagating direction is ignored. Also, partially set small blocks after the fully set small block in the pulse propagating direction are ignored except for a partially set small block having the largest set portion and the fully set small block.

That is, small blocks enclosed with the thick frames in FIG. 36B are ignored and hence do not contribute to a delay. If the AND gate circuits 131 are not used, the fully set small block sandwiched between the partially set small blocks is also ignored. From the foregoing, the number of small blocks to be ignored does not exceed 3.

The scale of small blocks and the like will be considered below by theoretically handling the influence of jitters in an arrangement thus divided into small blocks.

Assume that the period of an external clock is τ and the cycle of the clock signal with number "1" shown in FIG. 32 is the start point. When a jitter in each cycle is taken into consideration, the periods of individual cycles have a relationship as shown in Table 1 below.

TABLE 1

| | |
|---|---|
| Between "2" and "1" (one cycle before) | τ + δ1 − δ2 |
| Between "3" and "2" (two cycles before) | τ + δ1 − δ3 |
| . | . |
| . | . |
| Between "n" and "n − 1" (n − 1 cycles before) | τ + δn − δn − 1 |
| Between "n − 1" and "n" and "n" (n cycles before) | τ + δn − 1 − δn |

A sample hold circuit SH is constructed of a plurality of state holding circuits, and these state holding circuits are divided into small blocks each having a state holding circuits. These small blocks are classified into n types to which "a", "b", "c", "d", . . . , are attached in the same manner as shown in FIGS. 36A and 36B. In this arrangement, the number of set stage holding circuits in each cycle is only 1/n for each type. Therefore, the period of each cycle is 1/n. Since each small block includes a units, one small block is partially set for each type, and the number of set units in this small block is $$\Delta i = \tau/n + (\delta i - \delta i + 1)/n \pmod{\alpha} \qquad (1)$$

for species i cycles before. $\Delta i$ has a as its modulus, so $0 \leq \Delta i < \alpha$ holds.

In the systems shown in FIGS. 35A to 36B, these insufficient small blocks are ignored but one, e.g., j. Accordingly, the timing of an internal signal generated in the cycle of a clock signal with number "1" and supposed to match the cycle of a clock signal with number "0" is $$T0 = \delta 1 + \sum_{i=1}^{n}(\tau + \delta i - \delta i + 1)/n - \left(\sum_{i=1}^{n} \Delta i - \Delta j\right) \qquad (2)$$

Hence, a jitter J in the internal signal is represented by $$J = T0 - \tau = \delta 1 + (\delta 1 - \delta n + 1)/n + \Delta j - \sum_{i=1}^{n} \Delta i \qquad (3)$$

where $-\delta \leq \delta i \leq \delta$ and $0 \leq \Delta i < \alpha$.
Therefore, $$-\delta - 2\delta/n - (n-1)\alpha < J \leq \delta + 2\delta/n \qquad (4)$$

holds.

In the synchronous adjustable delay shown in FIG. 7, $\pm 3\delta$ is a maximum jitter for n=1. When the size of a small block is taken into consideration, $\Delta i = 0$ for $\alpha = 1$, so $$J = T0 - \tau = \delta 1 + (\delta 1 - \delta n + 1)/n \qquad (5)$$

holds. This indicates that a jitter is minimized.

That is, each small block shown in FIGS. 35A to 36B is preferably constructed of one delay unit. A practical method of this arrangement will be described later. First, the effect of this arrangement will be theoretically estimated below.

Jitters in individual cycles are not completely random and have a certain correlation. This point will be considered next. That is, a strength $\beta$ of the correlation is introduced by $$\delta 1 = (1-\beta)r + \beta c \qquad (6)$$

where $0 \leq \beta \leq 1$, r is a random variable which satisfies $-\delta \leq r \leq \delta$, and c is a variable which correlates with another cycle and satisfies $-\delta \leq c \leq \delta$. c is represented as follows by using a correlation coefficient between cycles $$c = \sum_{i=2}^{\xi} c(1, i)\delta i \qquad (7)$$

In this equation (7), $\xi$ is the number of cycles corresponding to a correlation distance, and c(1,i) is a correlation coefficient between cycles 1 and i and satisfies c(1,i)>0.

Since c is a maximum when $\delta i = \delta$, $$\sum_{i=2}^{\xi} c(1, i) = 1 \qquad (8)$$

When the foregoing is taken into consideration, the jitter J in the internal signal is represented by $$J = \left\{1 - \beta + \frac{(1-\beta)}{n}\right\}r + \beta\left(1 + \frac{1}{n}\right)\sum c(1, i)\delta i - \frac{\delta n + 1}{n} \qquad (9)$$

where $$\sum_{i=2}^{\xi}$$

is abbreviated as $\Sigma$.

The range of this J will be evaluated next.

When $\xi < n+1$, i.e., in a cycle exceeding the correlation distance, the average is maximum when $r=\delta$, $\delta i=\delta$, and $\delta n+1=-\delta$ and is minimum when $r=-\delta$, $\delta i=-\delta$, and $\delta n+1=-\delta$. A substitution of these parameters yields $$-\delta - \frac{2\delta}{n} \leq J \leq \delta + \frac{2\delta}{n} \qquad (10)$$

As indicated by equation (10) above, the result is the same as in FIG. 32; the larger the number of cycles for calculating the average, the smaller the effect of jitter amplification. Note that FIG. 32 corresponds to a case in which the correlation distance is extremely short or there is no correlation.

When $\xi \geq n+1$, i.e., when the average is calculated within the correlation distance, the condition under which J is maximum or minimum changes in accordance with whether the coefficient $\delta n+1$ is positive or negative.

$$\beta\left(1 + \frac{1}{n}\right)\sum_{i=2}^{\xi} c(1, i)\delta i - \frac{\delta n + 1}{n} = \qquad (11)$$

$$\beta\left(1 + \frac{1}{n}\right)\sum_{i \neq n+1}^{\xi} c(1, i)\delta i + \left\{\beta\left(1 + \frac{1}{n}\right)c(1, n+1) - \frac{1}{n}\right\}\delta n + 1$$

Since this equation (11) holds, if the value in the braces in the second term on the right side is positive, i.e., if $$An \geq \frac{1}{n+1} \qquad (12)$$

where An represents $\beta c\{1, n+1\}$ holds, J is maximum when $r=\delta$, $\delta i=\delta$, and $\delta n+1=\delta$ and is minimum when $r=-\delta$, $\delta i=-\delta$, and $\delta n+1=-\delta$. From equation (8), $$\sum_{i \neq n+1}^{\xi} c(1, i) = 1 - c(1, n+1) \qquad (13)$$

When this relationship is used, $-\delta \leq J \leq \delta$ holds, so a jitter is not amplified. If $$An < \frac{1}{n+1} \qquad (14)$$

holds, the value in the braces in the second term on the right side of equation (11) is negative. So J is maximum when $r=\delta$, $\delta i=\delta$, and $\delta n+1=-\delta$ and is minimum when $r=-\delta$, $\delta i=-\delta$, and $\delta n+1=\delta$. Accordingly, $$-\delta(1-2An) - \frac{2\delta(1-An)}{n} \le J \le \delta(1-2An) + \frac{2\delta(1-An)}{n} \quad (15)$$

holds.

From the foregoing, amplification of jitters further decreases when the jitters are averaged within the correlation distance, and no jitter amplification occurs any longer depending on a correlation amount An. For example, when jitters are averaged over two cycles, An=1/3 is the turning point of conditions. Therefore, if a correlation of about 33% or more exists with respect to that two cycles before, jitters remain the same as in an external clock signal. Even if the correlation is 33% or less, a jitter increase is at most $\delta(1-3\Delta An)$ as can be seen when n=2 in equation (15).

When jitters are averaged over four cycles, An=1/5 is the turning point of conditions. Hence, if a correlation of 20% or more exists with respect to that four cycles before, jitters remain the same as in an external signal. Even if the correlation is 20% or less, a jitter increase is at most $\delta(1-5An)/2$ as is apparent when n=4 in equation (15).

The number of cycles over which jitters are optimally averaged changes in accordance with the dependence of a correlation coefficient on cycle. However, the principle that a jitter increase is greatly suppressed when jitters are averaged over two or more cycles remains the same. If An=0 in a case where there. is no correlation, the same effect as in FIG. 32 is of course obtained.

Figure 37:
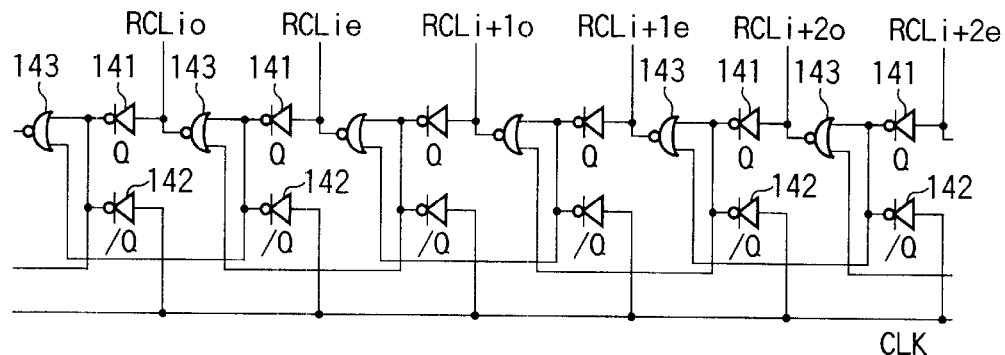
FIG. 37 is a view showing a practical circuit configuration of a backward delay when a small block of the backward delay is constructed of one delay unit and jitters contained in an external clock signal are averaged over two cycles in the third embodiment.

FIG. 37 shows a practical circuit configuration of a synchronous adjustable delay when each small block as described above is constructed of one delay unit.

FIG. 37 shows details of the backward delay BD shown in FIGS. 35A and 35B. In FIG. 37, each delay unit includes two clocked inverter circuits 141 and 142 and one NOR gate circuit 143. These two clocked inverter circuits 141 and 142 are equivalent to the two clocked inverter circuits 44 and 45 shown in FIG. 8 explained earlier. The operations of the two clocked inverter circuits 141 and 142 are controlled by output control pulses Q and /Q from a state holding circuit in the same delay unit. The NOR gate circuit 143 has the functions of both the inverter circuit 46 shown in FIG. 8 and the AND gate circuit 131 shown in FIGS. 35A and 35B. This NOR gate circuit 143 receives output signals from the two clocked inverter circuits 141 and 142.

In the backward delay BD with the above arrangement, the two clocked inverter circuits 141 and 142 in each delay unit function as delay elements for transmitting a pulse signal RCL from the succeeding stage to the preceding stage or as an entrance for introducing a clock signal to a delay path of a backward pulse, on the basis of the output control pulses Q and /Q from a state holding circuit in the same delay unit. Also, each delay unit receives its own state and a state from the succeeding stage and sends an output signal RCLio or RCLie to a corresponding state holding circuit.

Figure 38:
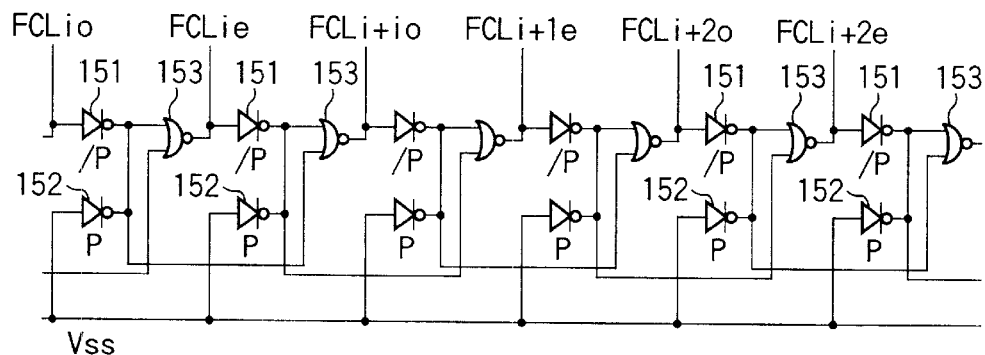
FIG. 38 is a view showing a practical circuit configuration of a forward delay when a small block of the forward delay is constructed of one delay unit and jitters contained in an external clock signal are averaged over two cycles in the third embodiment.

As shown in FIG. 38, the basic arrangement of a forward delay FD in this case is identical with the backward delay BD. That is, two clocked inverter circuits 151 and 152 are equivalent,to the two clocked inverter circuits 41 and 42 shown in FIG. 8. Also, a NOR gate circuit 153 has the functions of both the inverter circuit 43 shown in FIG. 8 and the AND gate circuit 131. This NOR gate circuit 153 receives output signals from the two clocked inverter circuits 151 and 152.

Figure 39:
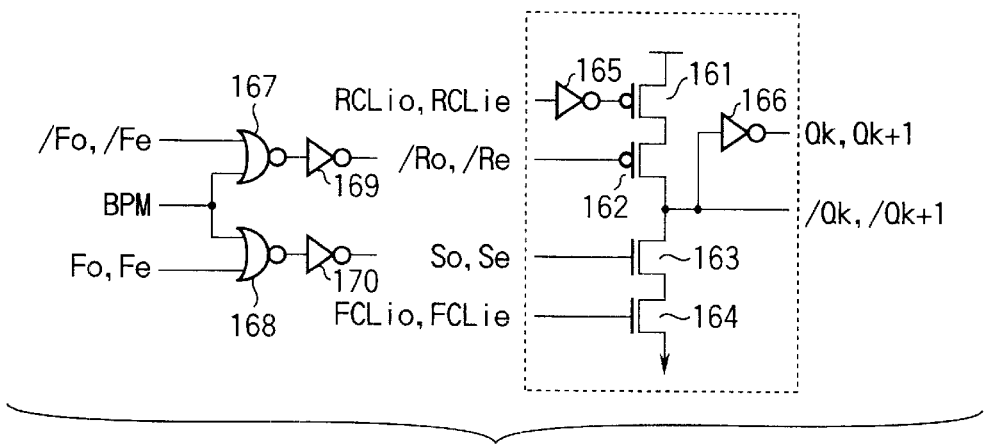
FIG. 39 is a circuit diagram showing a state holding circuit and its control circuit when jitters contained in an external clock signal are averaged over two cycles in the third embodiment.

FIG. 39 shows a state holding circuit formed in each delay unit described above together with a control circuit for selecting a group to be set or reset on each clock cycle. In FIG. 39, a circuit enclosed with the broken lines is the state holding circuit which is formed in each delay unit of the forward delay FD for transmitting a forward pulse signal.

In this state holding circuit, two p-channel MOS transistors 161 and 162 and two n-channel MOS transistors 163 and 164 are inserted in series with each other between a power source potential supply node and a ground potential supply node.

A pulse signal RCLio or RCLie is supplied to the gate of the p-channel MOS transistor 161 via an inverter circuit 165. An output signal /Ro or /Re from a control circuit (to be described later) is supplied to the gate of the p-channel MOS transistor 162. An output signal So or Se from the control circuit is supplied to the gate of the n-channel MOS transistor 163. A pulse signal FCLio or FCLie. is supplied to the gate of the n-channel MOS transistor 164.

A series-connected node between the p-channel MOS transistor 162 and the n-channel MOS transistor 163 outputs a control pulse signal /Qk or /Qk+1. An inverter circuit 166 inverts this control pulse signal /Qk or /Qk+1 and outputs a control pulse signal Qk or Qk+1.

The control circuit of this state holding circuit is constructed of a NOR gate circuit 167, a NAND gate circuit 168, and two inverter circuits 169 and 170. The NOR gate circuit 167 receives a control signal /Fo or /Fe and a control signal BPM. The NAND gate circuit 168 receives a control signal Fo or Fe and the control signal BPM. The inverter circuit 169 inverts an output signal from the NOR gate circuit 167 to generate the signal /Ro or /Re. Likewise, the inverter circuit 170 inverts an output signal from the NAND gate circuit 168 to generate the signal So or Se.

In the stage holding circuit shown in FIG. 39, the series-connected node between the transistors 162 and 163 functions as a signal node for outputting a signal corresponding to the set/reset state. The transistors 161 and 162 supply electric charge to this signal node. The transistors 163 and 164 extract electric charge from this signal node. When both the transistors 163 and 164 are turned on, a set output (/Q is LOW level and Q is HIGH level) is obtained at the signal node. When both the transistors 161 and 162 are turned on, a reset output (/Q is HIGH level and Q is LOW level) is obtained at the signal node.

That is, the state holding circuit is set when the control pulse signal Qk or Qk+1 rises to HIGH level in accordance with the forward pulse signal FCLio or FCLie. However, this set operation is performed only when the signal So or Se is at HIGH level with respect to the signal FCLio or FCLie.

Also, the state holding circuit is reset when receiving the pulse signal RCLio or RCLie from a delay unit constructing the forward delay FD, and thereby the control pulse signal Qk or Qk+1 falls. However, this reset operation is performed only when the signal /Ro or /Re is at LOW level with respect to the signal RCLio or RCLie.

The signals /Fo and Fo control the levels of these signals /Ro and So; when the signal Fo is at LOW level, the signals /Ro and So are at HIGH level and LOW level, respectively. If this is the case, the state holding circuit is neither set nor reset, and the state of the preceding signal Qk is dynamically maintained. This holds for the combination of the signals /Re and Se and the signals /Fe and Fe.

The control signal BPM resets the state holding circuit at the timing at which the signal changes to LOW level if the state holding circuit is in a set/reset acceptable cycle.

In this manner, an effective cycle of the state holding circuit can be determined by controlling the control signal Fo or Fe. A control signal generating circuit for generating these control signals Fo and Fe will be described below with reference to FIGS. 40A and 40B.

When jitters are averaged over two cycles as described above, it is only necessary to alternately generate the signals Fo and Fe on each cycle of an external clock signal and alternately set and reset the state holding circuits for every other delay unit.

A circuit shown in FIG. 40A includes an AND gate circuit 171, delay circuits 172 and 173, and NAND gate circuits 174, 175, 176, and 177. The AND gate circuit 171 receives the clock signal CLK and an inverted signal of a forward pulse signal FCL0. The delay circuit 172 delays the control signal Fe a predetermined time. The delay circuits 173 delays the control signal Fo a predetermined time. The NAND gate circuit 174 receives an output signal a from the AND gate circuit 171 and a delayed output signal from the delay circuit 172. The NAND gate circuit 175 receives the output signal a from the AND gate circuit 171 and a delayed output signal from the delay circuit 173. The two NAND gate circuits 176 and 177 construct a flip-flop circuit by so-called cross connection, i.e., by supplying an output signal from one circuit to the other as its input signal.

An output signal from each of the NAND gate circuits 174 and 175 is supplied as one remaining input signal to a corresponding one of the NAND gate circuits 176 and 177. The control signals Fo and Fe are obtained as output signals from these NAND gate circuits 176 and 177. The obtained control signals Fo and Fe are fed back to the delay circuits 172 and 173.

FIG. 40B shows a practical circuit configuration of each of the delay circuits 172 and 173 shown in FIG. 40A. These two delay circuits 172 and 173 are similarly constructed of two clocked inverter circuits 181 and 182 and a positive feedback circuit 183. The clocked inverter circuit 181 inverts the signal Fe or Fo when an inverted signal /a of the output signal a from the AND gate circuit 171 is at HIGH level. The clocked inverter circuit 182 inverts a signal from the output node of the clocked inverter circuit 181 when the signal a is at HIGH level. The positive feedback circuit 183 includes two series-connected inverter circuits and positively feeds the signal back from the output node of the clocked inverter circuit 181 to the same node.

The control signal generating circuit shown in FIG. 40B uses the principle that the two signals Fo and Fe do not take the same state at the same time in the flip-flop circuit including the two NAND gate circuits 176 and 177. The states of the signals Fo and Fe are alternately switched every cycle before the clock signal CLK rises to input the forward pulse signal to the forward delay FD and while the backward pulse is being transmitted in the backward delay BD. Consequently, the total number of set state holding circuits becomes the average over two cycles for each cycle. Therefore, the backward pulse is transmitted in the same number of delay units as this total number in the backward delay.

A practical circuit configuration when each small block includes one delay unit and jitters are averaged over four cycles as in the case shown in FIGS. 36A and 36B will be described below.

FIG. 41 shows details of the backward delay in the case shown in FIGS. 36A and 36B. In this backward delay, each delay unit includes two clocked inverter circuits 141 and 142 and one NOR gate circuit 144. Unlike the NOR gate circuit 143 shown in FIG. 37, this NOR gate circuit 144 has four input terminals to receive output signals from four delay units. The rest of the arrangement and the basic operation are the same as in FIG. 37, so a detailed description thereof will be omitted.

FIG. 42 shows details of the forward delay FD in the case shown in FIGS. 36A and 36B. In this forward delay FD, each delay unit includes two clocked inverter circuits 151 and 152 and one NOR gate circuit 154. Unlike the NOR gate circuit 153 shown in FIG. 38, this NOR gate circuit 154 has four input terminals to receive output signals from four delay units. The rest of the arrangement and the basic operation are the same as in FIG. 38, so a detailed description thereof will be omitted.

FIG. 43 shows a state holding circuit formed in each delay unit together with a control circuit for selecting groups to be set or reset on each clock cycle when delay times are averaged over four cycles as described above. In FIG. 43, a portion enclosed by the broken lines is the state holding circuit. This state holding circuit includes two p-channel MOS transistors 191 and 192, two n-channel MOS transistors 193 and 194, and two inverter circuits 195 and 196. One of pulse signals RCLia, RCLib, RCLic, RCLid is supplied to the gate of the p-channel MOS transistor 191 via the inverter circuit 195.

One of output signals /Ra, /Rb, /Rc, and /Rd from the control circuit (to be described later) is supplied to the gate of the p-channel MOS transistor 192. One of output signals Sa, Sb, Sc, and Sd from the control circuit is supplied to the gate of the n-channel MOS transistor 193. One of pulse signals FCLia, FCLib, FCLic, and FCLid is supplied to the gate of the n-channel MOS transistor 194.

One of control pulse signals /Qk, /Qk+1, /Qk+2, and /Qk+3 is output from a series-connected node between the p-channel MOS transistor 192 and the n-channel MOS transistor 193. The inverter circuit 196 inverts this control pulse signal /Qk, /Qk+1, /Qk+2, or /Qk+3 and outputs one of control signals Qk, Qk+1, Qk+2, and Qk+3.

The control circuit of this state holding circuit includes a NOR gate circuit 197, a NAND gate circuit 198, and two inverter circuits 199 and 200. The NOR gate circuit 197 receives one of control signals /Fa, /Fb, /Fc, and /Fd and the control signal BPM described earlier. The NAND gate circuit 198 receives one of control signals Fa, Fb, Fc, and Fd and the control signal BPM. The inverter circuit 199 inverts an output signal from the NOR gate circuit 197 to generate one of the signals /Ra, /Rb, /Rc, and /Rd. The inverter circuit 200 inverts an output signal from the NAND gate circuit 198 to generate one of the signals Sa, Sb, Sc, and Sd.

The state holding circuit shown in FIG. 43 is set when one of the control pulse signals Qk, Qk+1, Qk+2, and Qk+3 rises by one of the forward pulse signals FCLia, FCLib, FCLic, and FCLid. However, this set operation is performed only when the signal Sa, Sb, Sc, or Sd is at HIGH level with respect to the signal FCLia, FCLib, FCLic, or FCLid.

Also, the state holding circuit is reset when receiving one of the output pulse signals RCLia, RCLib, RCLic, and RCLid from the delay unit constructing the forward delay FD, and one of the control pulse signals Qk, Qk+1, Qk+2, and Qk+3 falls. However, this reset operation is performed only when the signal /Ra, /Rb, /Rc, or /Rd is at LOW level with respect to the signal RCLia, RCLib, RCLic, or RCLid.

For example, the signals /Fa and Fa control the levels of the signals /Ra and Sa; when the signal Fa is at LOW level, the signals /Ra and Sa changes to HIGH level and LOW level, respectively. If this is the case, the state holding circuit is neither set nor reset, and the state of the preceding signal Qk is dynamically maintained. This holds for the combinations of the signals /Rb and Sb and the signals /Fb and Fb, the signals /Rc and Sc and the signals /Fc and Fc, and the signals /Rd and Sd and the signals /Fd and Fd.

In this manner, an effective cycle of the state holding circuit can be determined by controlling the control signals Fa, Fb, Fc, and Fd.

Control signal generating circuits for generating these control signals Fa, Fb, Fc, and Fd will be described below with reference to FIGS. 44A, 44B, and 44C.

When jitters are averaged over four cycles as described above, the signals Fa, Fb, Fc, and Fd are sequentially generated in four cycles of an external clock signal.

A circuit shown in FIG. 44A receives the signal Fo obtained by the circuit shown in FIG. 40A. This circuit includes an edge pulse generating circuit 205, delay circuits 206 and 207, and NAND gate circuits 208, 209, 210, and 211. The edge pulse generating circuit 205 is constructed of an inverter circuit 201, a delay circuit 202, a NAND gate circuit 203, and an inverter circuit 204 and generates a pulse signal synchronizing with the leading edge of the signal Fo. The delay circuit 202 delays an output signal from the inverter circuit 201 by a predetermined time. The NAND gate circuit 203 receives an output signal from the delay circuit 202 and the signal Fo. The inverter circuit 204 inverts an output signal from the NAND gate circuit 203. The delay circuit 206 delays a control signal Fee by a predetermined time. The delay circuit 207 delays a control signal Foo by a predetermined time. The NAND gate circuit 208 receives an output signal b from the edge pulse generating circuit 205 and a delayed output signal from the delay circuit 206. The NAND gate circuit 209 receives the output signal b from the edge pulse generating circuit 205 and a delayed output signal from the delay circuit 207. The two NAND gate circuits 210 and 211 construct a flip-flop circuit by so-called cross connection, i.e., by supplying an output signal from one circuit to the other as its input signal.

An output signal from each of the NAND gate circuits 208 and 209 is supplied as one remaining input signal to a corresponding one of the NAND gate circuits 210 and 211. The control signals Foo and Fee are obtained as output signals from these NAND gate circuits 210 and 211, respectively. The obtained control signals Foo and Fee are fed back to the delay circuits 207 and 206, respectively.

FIG. 44B shows a practical circuit configuration of each of the delay circuits 206 and 207. These two delay circuits are similarly constructed of clocked inverter circuits 221 and 222 and a positive feedback circuit 223. The clocked inverter circuit 221 inverts the signal Fee or Foo when an inverted signal /b of the output signal b from the edge pulse generating circuit 205 is at HIGH level. The clocked inverter circuit 222 inverts a signal from the output node of the clocked inverter circuit 221 when the signal b is at HIGH level. The positive feedback circuit 223 includes two series-connected inverter circuits and positively feeds the signal back from the output node of the clocked inverter circuit 221 to the same node.

FIG. 44C shows the configuration of a circuit for generating the control signals Fa, Fb, Fc, and Fd and their inverted signals /Fa, /Fb, /Fc, and /Fd from the control signals Foo and Fee obtained by the circuit shown in FIG. 44A. Four such circuits as shown in FIG. 44C are formed to generate four pairs of the signals Fa and /Fa, Fb and /Fb, Fc and /Fc, and Fd and /Fd.

This circuit is constructed of an AND gate circuit 224 and an inverter circuit 225. The AND gate circuit 224 receives the control signals Fo and Foo, Fe and Foo, Fo and Fee, and Fe and Fee and outputs the control signals Fa, Fb, Fc, and Fd. The inverter circuit 225 inverts these control signals Fa, Fb, Fc, and Fd and outputs the control signals /Fa, /Fb, /Fc, and /Fd.

The control signal generating circuit shown in FIG. 43 also uses the principle that the two signals Foo and Fee do not take the same state at the same time in the flip-flop circuit constructed of the two NAND gate circuits 210 and 211. The circuit shown in FIG. 43 is different from the circuit shown in FIG. 40A in that the leading edge of the signal Fo is used to change the states of the signals Foo and Fee. That is, since the signal Fo rises every other cycle, each of the signals Foo and Fee maintains the same state in two consecutive cycles and changes its state every two cycles. By using these signals Foo and Fee, it is possible to change the state every cycle to generate the control signals Fa, Fb, Fc, and Fd rising in turn over four cycles and their inverted signals.

In the third embodiment as described above, the effects of jitters in external clock signals are averaged over a plurality of cycles. Therefore, in addition to the effect of reliably transferring data by adjusting the timings of internal clock signals, the third embodiment has an effect of more reliably transferring data by reducing adverse effects of jitters in external clock signals.

According to the present invention as has been described above, it is possible to provide a high-speed data transfer synchronizing system and high-speed data transfer synchronizing method capable of performing high-speed synchronous data transfer without very strictly restricting the physical conditions of buses between memory modules and a memory controller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-speed data transfer synchronizing system, comprising:
   a plurality of memory modules for receiving a clock signal to operate in synchronism with the clock signal, each of said memory modules having at least one internal clock signal generating circuit to generate at least one internal clock signal, said at least one internal clock signal synchronizing with the clock signal, said at least one internal clock signal generating circuit having a function of adjusting a generation timing of the internal clock signal having different phases from the clock signal; and
   a memory controller for generating and supplying the clock signal to said memory modules and transferring/receiving data to/from said memory modules.

2. A system according to claim 1, wherein said at least one internal clock signal generating circuit comprises:
   a first internal clock signal generating circuit for generating a first internal clock signal for data write; and
   a second internal clock signal generating circuit for generating a second internal clock signal generating circuit for data read.

3. A system according to claim 2, wherein each of said first and second internal clock signal generating circuits comprises:
   a first buffer circuit for receiving the clock signal;
   a first delay circuit having a signal delay time substantially equal to a signal delay time in said first buffer circuit, said first delay circuit receiving an output signal from said first buffer circuit and delaying the output signal from said first buffer circuit;
   a second delay circuit for receiving an output signal from said first delay circuit and delaying the output signal from said first delay circuit by a predetermined time;

a second buffer circuit for receiving an output signal from said second delay circuit;

a third delay circuit comprising a plurality of cascaded first delay units to receive an output signal from said second buffer circuit and delay the output signal from said second buffer circuit, by transmitting the signal by said plurality of first delay units, for a period corresponding to a cycle of the clock signal;

a fourth delay circuit comprising a plurality of cascaded second delay units to receive the signal delayed by said third delay circuit and delay the delayed signal by transmitting the signal by the same number of second delay units as the number of first delay units by which the output signal from said second buffer circuit is transmitted;

a variable delay circuit for receiving an output signal from said fourth delay circuit and outputting the output signal from said fourth delay circuit after delaying the signal by a time corresponding to a control signal; and a third buffer circuit having a signal delay time substantially equal to a signal delay time in said second buffer circuit, said third buffer circuit receiving an output signal from said variable delay circuit and generating the internal clock signal.

4. A system according to claim 3, wherein said variable delay circuit comprises:

a plurality of unit delay elements so connected in series as to have two terminals and a plurality of series-connected nodes, one of said two terminals receiving the output signal from said fourth delay circuit; and a plurality of first switching circuits connected in a one-to-one correspondence with said series-connected nodes of said unit delay elements to select signals from said series-connected nodes on the basis of the control signal.

5. A system according to claim 4, further comprising a second switching circuit for selecting a signal from a specific one of said series-connected nodes of said unit delay elements.

6. A system according to claim 3, further comprising a control circuit for receiving a command from said memory controller and generating the control signal on the basis of the command.

7. A system according to claim 1, wherein said at least one internal clock signal generating circuit comprises:

a first pulse delay circuit including a plurality of cascaded first delay units each having a predetermined signal delay time to transmit a first pulse by said first delay units;

a second pulse delay circuit including a plurality of cascaded second delay units each having a predetermined signal delay time to transmit a second pulse by said second delay units; and a plurality of state holding circuits formed to have a one-to-one correspondence with said first delay units in said first pulse delay circuit and said second delay units in said second pulse delay circuit and capable of taking reset and set states, a state holding circuit corresponding to a first delay unit by which the first pulse is transmitted being set, a second delay unit in said second pulse delay circuit, which corresponds to said set state holding circuit, transmitting the second pulse from a second delay unit in a succeeding stage to a second delay unit in a preceding stage, a second delay unit in said second pulse delay circuit, which corresponds to a reset state holding circuit, directly transmitting an internal clock signal to a second delay unit in a preceding stage, said state holding circuits being divided into a plurality of groups, and cycles of signals for setting said state holding circuits in units of groups being sequentially shifted.

8. A system according to claim 7, wherein each of said second delay units comprises:

a first clocked inverter circuit for receiving an output signal from another second delay unit as an input signal and operating as an inverter circuit when receiving an output signal from said state holding circuit which is in a set state;

a second clocked inverter circuit for receiving said second pulse and operating as an inverter circuit when receiving an output signal from said state holding circuit which is in a reset state; and a NOR gate circuit for receiving output signals from said first and second clocked inverter circuits.

9. A system according to claim 7, wherein each of said plurality of state holding circuits comprises:

a signal node for outputting signals corresponding to the set and reset states;

a first transistor ON/OFF-controlled by an output signal from a second delay unit in said second pulse delay circuit to supply electric charge to said signal node; and a second transistor ON/OFF-controlled by an output signal from a first delay unit in said first pulse delay circuit to extract electric charge from said signal node, a signal corresponding to the set state is obtained at said signal node when said second transistor is turned on, a signal corresponding to the reset state is obtained at said signal node when said first transistor is turned on, and said first and second transistors are so controlled as not to be turned on at the same time.

10. A system according to claim 7, wherein said plurality of state holding circuits are divided into two groups, state holding circuits belonging to each group are alternately arranged to have a one-to-one correspondence with corresponding first and second delay units in said first and second pulse delay circuits, and a cycle of the clock signal which nullifies functions of all said first and second transistors in state holding circuits belonging to one group and a cycle of the clock signal which nullifies functions of all said first and second transistors in state holding circuits belonging to the other group are so controlled as to alternately appear.

11. A system according to claim 7, wherein said plurality of state holding circuits are divided into first, second, third, and fourth groups, state holding circuits belonging to each group are arranged in order and alternately to have a one-to-one correspondence with corresponding first and second delay units in said first and second pulse delay circuits, and a cycle of the clock signal which nullifies functions of all said first and second transistors in state holding circuits belonging to the first group, a cycle of the clock signal which nullifies functions of all said first and second transistors in state holding circuits belonging to the second group, a cycle of the clock signal which nullifies functions of all said first and second transistors in state holding circuits belonging to the third group, and a cycle of the clock signal which nullifies functions of all said first and second transistors in state holding circuits belonging to the fourth group are so controlled as to be continuous cycles.

12. A clock signal generating circuit comprising:

a first buffer circuit for receiving an external clock signal;

a first delay circuit having a signal delay time substantially equal to a signal delay time in said first buffer circuit, said first delay circuit receiving an output signal from said first buffer circuit and delaying the output signal from said first buffer circuit;

a second delay circuit for receiving an output signal from said first delay circuit and delaying the output signal from said first delay circuit by a predetermined time;

a second buffer circuit for receiving an output signal from said second delay circuit;

a third delay circuit including a plurality of cascaded multi-stage first delay units to receive an output signal from said second buffer circuit and delay the output signal from said second buffer circuit, by transmitting the signal by said plurality of first delay units, for a period corresponding to a cycle of the clock signal;

a fourth delay circuit including a plurality of cascaded multi-stage second delay units to receive a signal delayed by said third delay circuit and delay the delayed signal by transmitting the signal by the same number of second delay units as the number of first delay units by which the output signal from said second buffer circuit is transmitted;

a variable delay circuit for receiving an output signal from said fourth delay circuit and outputting the output signal from said fourth delay circuit after delaying the signal by a time corresponding to a control signal; and a third buffer circuit having a signal delay time substantially equal to a signal delay time in said second buffer circuit, said third buffer circuit receiving an output signal from said variable delay circuit and generating an internal clock signal.

13. A circuit according to claim 12, wherein said variable delay circuit comprises:

a plurality of unit delay elements so connected in series as to have two terminals and a plurality of series-connected nodes, one of said two terminals receiving the output signal from said fourth delay circuit; and a plurality of first switching circuits connected in a one-to-one correspondence with said series-connected nodes of said unit delay elements to select signals from said series-connected nodes on the basis of the control signal.

14. A circuit according to claim 13, further comprising a second switching circuit for selecting a signal from a specific one of said series-connected nodes of said unit delay elements.

15. A high-speed data transfer synchronizing method for a high-speed data transfer synchronizing system comprising:

a plurality of memory modules for receiving a clock signal to operate in synchronism with the clock signal, each of said memory modules having an internal clock signal generating circuit to generate at least one internal clock signal, said at least one internal clock signal synchronizing with the clock signal, said at least one internal clock signal generating circuit having a function of adjusting a generation timing of the internal clock signal on the basis of a control signal; and a memory controller for generating and supplying the clock signal to said memory modules and transferring/receiving data to/from said memory modules, comprising the steps of:

storing a predetermined data pattern in said memory modules;

reading out the data pattern stored in each memory module from said memory modules and transferring the readout data pattern to said memory controller; and comparing the data pattern transferred from each memory module with the original predetermined data pattern and generating the control signal such that the two data patterns match.

16. A method according to claim 15, wherein the control signal is generated on the basis of a command supplied from said memory controller to each of said memory modules.

17. A method according to claim 15, wherein when the predetermined data pattern is to be stored in said plurality of memory modules, the data pattern is transferred from said memory controller at slower transfer timing than transfer timing in normal operation and stored in said plurality of memory modules.

18. A method according to claim 15, wherein when the data pattern stored in each of said plurality of memory modules is to be read out and transferred to said memory controller, the data pattern is read out as burst data from each memory module at transfer timing in normal operation.

19. A method according to claim 15, wherein when the predetermined data pattern is to be stored in said plurality of memory modules, the data pattern is transferred from said memory controller at transfer timing in normal operation and stored in said plurality of memory modules, and when the data pattern stored in each of said plurality of memory modules is to be read out and transferred to said memory controller, the data pattern is read out as burst data from each memory module at transfer timing in normal operation.

20. A high-speed data transfer synchronizing method for a high-speed data transfer synchronizing system comprising:

a plurality of memory modules for receiving a clock signal to operate in synchronism with the clock signal, said memory modules previously storing a predetermined data pattern, each of said memory modules having an internal clock signal generating circuit to generate at least one internal clock signal, said at least one internal clock signal synchronizing with the clock signal, said at least one internal clock signal generating circuit having a function of adjusting a generation timing of the internal clock signal on the basis of a control signal; and a memory controller for generating and supplying the clock signal to said memory modules and transferring/receiving data to/from said memory modules, comprising the steps of:

reading out the data pattern previously stored in each memory module and transferring the readout data pattern to said memory controller; and comparing the data pattern transferred from each memory module with the original data pattern previously stored in each memory module and generating the control signal such that the two data patterns match.

21. A method according to claim 20, wherein the control signal is generated on the basis of a command supplied from said memory controller to each of said plurality of memory modules.

22. A method according to claim 20, wherein when the data pattern previously stored in each of said plurality of memory modules is to be read out and transferred to said memory controller, the data pattern is read out as burst data from each memory module at transfer timing in normal operation.

* * * * *